(12) United States Patent
Tsuno et al.

(10) Patent No.: US 9,005,390 B2
(45) Date of Patent: Apr. 14, 2015

(54) ROOM TEMPERATURE BONDING APPARATUS

(75) Inventors: Takeshi Tsuno, Yokohama (JP); Takayuki Goto, Yokohama (JP); Masato Kinouchi, Yokohama (JP); Satoshi Tawara, Yokohama (JP); Jun Utsumi, Yokohama (JP); Yoichiro Tsumura, Hiroshima (JP); Kensuke Ide, Ritto (JP); Takenori Suzuki, Ritto (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 13/530,714

(22) Filed: Jun. 22, 2012

(65) Prior Publication Data
US 2012/0285624 A1 Nov. 15, 2012

Related U.S. Application Data

(62) Division of application No. 12/919,997, filed as application No. PCT/JP2008/054344 on Mar. 11, 2008, now Pat. No. 8,857,487.

(30) Foreign Application Priority Data

Feb. 29, 2008 (JP) .................. 2008-050551

(51) Int. Cl.
*B29C 65/00* (2006.01)
*B32B 37/00* (2006.01)
(Continued)

(52) U.S. Cl.
CPC .... *H01L 21/67778* (2013.01); *H01L 21/67092* (2013.01); *H01L 21/6732* (2013.01); *H01L 21/67748* (2013.01); *H01L 21/68* (2013.01); *H01L 21/683* (2013.01)

(58) Field of Classification Search
USPC ....................................... 156/285–286, 382
See application file for complete search history.

(56) References Cited

U.S. PATENT DOCUMENTS 3,641,283 A 2/1972 Brooke
3,661,661 A 5/1972 Berleyoung
(Continued)

FOREIGN PATENT DOCUMENTS

CN 1680188 A 10/2005
JP 61-76242 A 4/1986
(Continued)

OTHER PUBLICATIONS

Office Action in the corresponding Chinese application and partial translation.
(Continued)

*Primary Examiner* — Richard Crispino
*Assistant Examiner* — Matthew Hoover
(74) *Attorney, Agent, or Firm* — Birch, Stewart, Kolasch & Birch, LLP

(57) ABSTRACT

A room temperature bonding apparatus includes angle adjustment means supporting a first sample stage holding a first substrate so as to be able to change a direction of the first sample stage; a first driving device driving the first stage in a first direction; a second driving device driving a second sample stage holding a second substrate in a second direction not parallel to the first direction; and a carriage support table supporting the second sample stage in the first direction when the second substrate and the first substrate are brought into contact. The apparatus can impose a load exceeding a withstand load of the second driving device on the first and second substrates. Further, the apparatus uses angle adjustment means to change direction of the first substrate to be parallel with the second substrate and uniformly impose the larger load on a bonding surface.

10 Claims, 18 Drawing Sheets

(51) Int. Cl.
    *H01L 21/677*      (2006.01)
    *H01L 21/67*      (2006.01)
    *H01L 21/673*      (2006.01)
    *H01L 21/68*      (2006.01)
    *H01L 21/683*      (2006.01)

(56) References Cited

U.S. PATENT DOCUMENTS

| | | | |
|---|---|---|---|
| 5,112,153 | A | 5/1992 | Gunn et al. |
| 5,963,388 | A | 10/1999 | Yoshida et al. |
| 5,989,342 | A | 11/1999 | Ikeda et al. |
| 2001/0050720 | A1 | 12/2001 | Karube et al. |
| 2003/0168145 | A1* | 9/2003 | Suga et al. ............ 156/60 |
| 2004/0108075 | A1 | 6/2004 | Choo et al. |
| 2005/0229737 | A1 | 10/2005 | Tsuno et al. |
| 2006/0051160 | A1 | 3/2006 | Sun et al. |
| 2007/0111471 | A1* | 5/2007 | Okada ............ 438/455 |

FOREIGN PATENT DOCUMENTS

| | | | |
|---|---|---|---|
| JP | 63-129319 A | | 6/1988 |
| JP | 6-61319 A | | 3/1994 |
| JP | 8-98076 A | | 4/1996 |
| JP | 2791429 B2 | | 8/1998 |
| JP | 11-223690 A | | 8/1999 |
| JP | 2000-31010 A | | 1/2000 |
| JP | 2001-135634 A | | 5/2001 |
| JP | 2001-230277 A | | 8/2001 |
| JP | 2001-351892 A | | 12/2001 |
| JP | 2002-64042 A | | 2/2002 |
| JP | 2003-318219 A | | 11/2003 |
| JP | 2004-207644 A | | 7/2004 |
| JP | 2005-191556 A | | 7/2005 |
| JP | 2005-268766 A | | 9/2005 |
| JP | 2005-288673 A | | 10/2005 |
| JP | 2005-311298 A | | 11/2005 |
| JP | 2006-134899 A | | 5/2006 |
| JP | 2006-222436 A | | 8/2006 |
| JP | 2006-317302 A | | 11/2006 |
| JP | 2007-96057 A | | 4/2007 |
| JP | 3970304 B1 | | 9/2007 |
| JP | 2007-266058 A | | 10/2007 |
| JP | 2007266058 A | * | 10/2007 |
| JP | 4209457 B1 | | 10/2008 |
| KR | 10-621957 | | 5/2006 |
| WO | WO 2007/069376 A1 | | 6/2007 |

OTHER PUBLICATIONS

Office Action in the corresponding Korean application with partial translation.
Extended European Search Report mailed Oct. 12, 2012 for corresponding EP Application No. 08721760.0.
Notice of Allowance mailed Apr. 10, 2012 for corresponding Korean Application No. 2010-7019010.
Notice of Allowance mailed May 8, 2012 in corresponding Chinese Application No. 200880127651.X.
Office Action mailed Aug. 2, 2012 for corresponding U.S. Appl. No. 12/919,997.
U.S. Office Action issued in U.S. Appl. No. 12/919,997 on Dec. 20, 2012.
Canadian Notice of Allowance and English translation, dated Sep. 22, 2014, for Canadian Application No. 2,717,076.
European Office Communication issued in European Application No. 08721760.0, dated May 2, 2014.

* cited by examiner

Fig. 18

| CASSETTE CHAMBER | | 82-1 | 82-2 | 82-3 | 82-4 |
|---|---|---|---|---|---|
| ↓ TIME | step 31 | • SETTING SUBSTRATE | • SETTING SUBSTRATE | | |
| | step 32 | • ARRANGING BONDING SUBSTRATE | | • SETTING SUBSTRATE | |
| | step 33 | | | • ARRANGING BONDING SUBSTRATE | • SETTING SUBSTRATE |
| | step 34 | • SETTING SUBSTRATE | • SETTING SUBSTRATE | | • ARRANGING BONDING SUBSTRATE |
| | step 35 | • ARRANGING BONDING SUBSTRATE | | • SETTING SUBSTRATE | • TAKING OUT |

REPEAT

Fig. 19

| CASSETTE CHAMBER | | 82-1 | 82-2 | 82-3 | 82-4 |
|---|---|---|---|---|---|
| TIME ↓ | step 41 | • SETTING SUBSTRATE | • SETTING SUBSTRATE | | |
| | step 42 | • ARRANGING BONDING SUBSTRATE | | • SETTING SUBSTRATE | • SETTING SUBSTRATE |
| | step 43 | • TAKING OUT • SETTING SUBSTRATE | • SETTING SUBSTRATE | • ARRANGING BONDING SUBSTRATE | |
| | step 44 | • ARRANGING BONDING SUBSTRATE | | • TAKING OUT • SETTING SUBSTRATE | • SETTING SUBSTRATE |

REPEAT

ROOM TEMPERATURE BONDING APPARATUS

This application is a divisional of U.S. patent application Ser. No. 12/919,997 filed on Aug. 27, 2010 now U.S. Pat. No. 8,857,487 which is a National Phase of PCT/JP2008/054344 filed Mar. 11, 2008, which claims priority under 35 U.S.C. §119(a) to Patent Application No 2008-050551 filed in Japan on Feb. 29, 2008, all of which are hereby expressly incorporated by reference in their entirety.

TECHNICAL FIELD

The present invention relates to a room temperature bonding apparatus, and more particularly, to a room temperature bonding apparatus that mass-produces products using a room temperature bonding technique. This application is based upon and claims the benefit of priority from Japanese patent application No. 2008-050551, the disclosure of which is incorporated herein in its entirety by reference.

BACKGROUND ART

There is known a MEMS in which minute electrical and mechanical components are integrated. As the MEMS, a micro relay, a pressure sensor, an acceleration sensor, or the like is exemplified. The MEMS is preferably manufactured by using room temperature bonding that has large bonding strength and does not require pressing with a load or thermal treatment. It is preferable that a room temperature bonding apparatus for this purpose is used for mass production of products, has a long lifetime, and is compact in size. Further, it is preferable that the room temperature bonding apparatus is convenient upon mass production of products, and produces a large production quantity per unit time.

There is known a room temperature bonding method in which two substrates formed with a plurality of patterns are bonded to a bonding substrate to thereby form a plurality of devices on the bonding substrate. In such a room temperature bonding method, preferably, a yield of the plurality of devices is improved and a load is more uniformly imposed on bonding surfaces.

Japanese patent No. 2791429 discloses a method for bonding silicon wafers, which realizes large bonding strength and does not require pressing with a load nor thermal treatment. The room temperature bonding method of silicon wafers is a method for bonding a silicon wafer to another silicon wafer, and characterized in that bonding surfaces of the both silicon wafers are sputter-etched prior to bonding by irradiating the bonding surfaces of the silicon wafers with an inert gas ion beam or an inert gas high-speed atomic beam in vacuum at room temperature.

Japanese patent publication No. 2001-351892 discloses a mounting method in which the bonding method is appropriately adapted more conveniently to an actual mounting process that requires mass production, and at the same time, the tact time of the whole mounting process is shortened. The mounting method is a mounting method for bonding a plurality of objects to be bonded to each other, and includes a cleaning step of cleaning surfaces of the respective objects by irradiating the surfaces with an energy wave, a transporting step of transporting the cleaned objects to a mounting step, and a mounting step of bonding the cleaned surfaces of the respective transported objects to each other at a room temperature.

Japanese patent publication No. 2003-318219 discloses a mounting method, which enables bonding surfaces to be washed effectively and uniformly by energetic wave or energetic particles, and avoids a problem of sticking of impurities due to opposed chamber wall surface etching also in washing in an inside of a chamber. The mounting method is characterized in that the energetic wave or energetic particles is emitted into a clearance formed between opposed bonding matters by one irradiation means for practically washing bonding surfaces of both of the bonding matters simultaneously; at least one of the bonding matters is rotated in the washing; and after a relative position between the washed bonding matters is aligned, the bonding matters are bonded mutually.

Japanese patent No. 3970304 discloses a room temperature bonding apparatus that can be compact in size and low in cost; enables an upper limit of a press-contact load to be extended eliminating restriction of a stage withstand load; and increases reliability at the time of application to an object that requires a high load upon bonding. The room temperature bonding apparatus includes: a bonding chamber that generates a vacuum ambient for room temperature bonding between an upper substrate and a lower substrate; an upper stage that is placed inside the bonding chamber and supports the upper substrate in the vacuum ambient; a carriage that is placed inside the bonding chamber and supports the lower substrate in the vacuum ambient; an elastic guide that is integrally bonded to the carriage; a positioning stage that is placed inside the bonding chamber and supports the elastic guide movably in a horizontal direction; a first mechanism that drives the elastic guide to move the carriage in the horizontal direction; a second mechanism that moves the upper stage in a vertical direction vertical to the horizontal direction; and a carriage support table that is placed inside the bonding chamber, and supports the carriage in a direction in which the upper stage moves when the lower substrate and the upper substrate are brought into press contact with each other. The elastic guide supports the carriage so as to prevent the carriage from coming into contact with the carriage support table when the lower substrate and the upper substrate are not in contact with each other, and is elastically deformed such that the carriage comes into contact with the carriage support table when the lower substrate and the upper substrate are brought into press contact with each other.

Japanese patent publication No. 2002-064042 discloses a mounting method in which a highly reliable bonding state can be obtained finally with extremely high accuracy. The mounting method is a mounting method for mutually bonding a plurality of objects to be bonded, and characterized in that a first object to be bonded, a second object to be bonded and its holding means, and a backup member having a positioning reference plane are separately arranged in this order; a parallelism of the second object to be bonded or its holding means is adjusted with respect to the positioning reference plane of the backup member; at the same time, a parallelism of the first object to be bonded or its holding means is adjusted with respect to the second object to be bonded or its holding means; the first and second objects to be bonded are temporarily bonded each other with both of the objects being in contact with each other; and then both of the objects are pressed against each other to be properly bonded to each other with the holding means of the second object to be bonded being brought into contact with the positioning reference place of the backup member.

DISCLOSURE OF INVENTION

An object of the present invention is to provide a room temperature bonding apparatus that more reliably bonds a substrate at room temperature.

Another object of the present invention is to provide a room temperature bonding apparatus that uniformly imposes a larger load on a bonding surface to be bonded.

Still another object of the present invention is to provide a room temperature bonding apparatus having a longer lifetime.

Yet another object of the present invention is to provide a room temperature bonding apparatus that can be more compact in size.

A further object of the present invention is to provide a room temperature bonding apparatus that achieves room temperature bonding at lower cost.

A still further object of the present invention is to provide a room temperature bonding apparatus that makes larger a production quantity of products per unit time.

A room temperature bonding apparatus according to the present invention includes: an angle adjustment mechanism that supports a first sample stage holding a first substrate to a first stage so as to be able to change a direction of the first sample stage; a first driving device that drives the first stage in a first direction; a second driving device that drives a second sample stage holding a second substrate in a second direction not parallel to the first direction; and a carriage support table that supports the second sample stage in the first direction when the second substrate and the first substrate are brought into press contact with each other. When the room temperature bonding apparatus brings the first substrate and the second substrate into press contact with each other, it can reduce a load imposed on the second driving device, and impose a larger load exceeding a withstand load of the second driving device on the first substrate and the second substrate. Further, the room temperature bonding apparatus can use the angle adjustment mechanism to change a direction of the first substrate such that a first surface of the first substrate, which faces to the second substrate, and a second surface of the second substrate, which faces to the first substrate, come into parallel contact with each other, and uniformly impose the larger load on a bonding surface.

The angle adjustment mechanism preferably includes: a ball flange that is fixed to the first sample stage; a ball seat that is fixed to the first stage; and a fixed flange that fixes the ball flange to the ball seat by caulking the ball flange.

The angle adjustment mechanism preferably includes: a plurality of shims; and a fastening tool that bonds the first stage and the first sample stage with some of the plurality of shims being sandwiched between the first stage and the first sample stage.

The angle adjustment mechanism preferably includes: a plurality of elements that expands or contracts by an electrical signal; and a fastening tool that bonds one end of each of the plurality of elements to the first sample stage, and the other end to the first stage.

The angle adjustment mechanism further includes: a sensor that measures a direction of a surface, which faces to the second substrate, of the first sample stage; and a controller that controls the plurality of elements on the basis of the measured direction of the surface. The controller controls the plurality of elements such that the measured surface becomes parallel to a reference surface. As the reference surface, a surface of the carriage support table, which faces to the second sample stage, a surface of the second sample stage, which holds the second substrate, or a surface of the second substrate, which is bonded to the first substrate, is exemplified. The room temperature bonding apparatus can correct the direction of the first sample stage without exposing a bonding chamber to air, and is therefore preferable.

The room temperature bonding apparatus according to the present invention further includes: a mechanical lock mechanism that mechanically fixes to the second sample stage a cartridge that fixes the second substrate. The room temperature bonding apparatus can hold the second substrate without use of electromagnetic force, which is effective if electromagnetic force is unfavorable for the second substrate.

Preferably, the room temperature bonding apparatus according to the present invention further includes: a coil that fixes a cartridge, which fixes the second substrate, to the second sample stage with use of magnetic force.

The room temperature bonding apparatus according to the present invention further includes: a light source that emits light; and a camera that images an image on the basis of reflected light of the light reflected by an alignment mark that is patterned on the first substrate or the second substrate. The carriage support table is formed with an observation window that transmits the light and the reflected light. The room temperature bonding apparatus drives the second sample stage on the basis of the image, and can thereby align the first substrate and the second substrate with each other such that the first substrate and the second substrate are bonded to each other at room temperature as designed.

The room temperature bonding apparatus according to the present invention includes: a bonding chamber that arranges the first sample stage and the second sample stage inside; a vacuum pump that exhausts gas from the inside of the bonding chamber through an exhaust port formed in the bonding chamber to generate a vacuum ambient inside the bonding chamber; and a surface cleaning device that, when a first surface facing to the second substrate of the first substrate and a second surface facing to the first substrate of the second substrate are separated from each other, irradiates a region between the first surface and the second surface with particles emitted from one site in the vacuum ambient. A centerline of a beam of the particles faces to a region excluding the exhaust port of an inner surface of the bonding chamber. Such room temperature bonding apparatus prevents contamination of the vacuum pump to increase a lifetime thereof.

The room temperature bonding apparatus according to the present invention includes: a bonding chamber that arranges the first sample stage and the second sample stage inside; a gate valve that opens or closes between a load lock chamber and the bonding chamber; a transfer device that transfers the first substrate and the second substrate from the load lock chamber to the bonding chamber through the gate valve; and a surface cleaning device that, when the first surface and the second surface are separated from each other, irradiates a region between the first surface and the second surface with particles emitted from one site in the vacuum ambient. A centerline of a beam of the particles faces to a region excluding the gate valve of an inner surface of the bonding chamber. Such room temperature bonding apparatus prevents contamination of the gate valve to increase the lifetime thereof.

The room temperature bonding apparatus according to the present invention further includes: a plurality of cassette chambers that can be mutually independently depressurized. The transfer device transfers the first substrate from a first cassette chamber among the plurality of cassette chambers to the bonding chamber, the second substrate from a second cassette chamber among the plurality of cassette chambers to the bonding chamber, and a bonding substrate in which the second substrate and the first substrate are bonded to each other at room temperature from the bonding chamber to one of the plurality of cassette chambers. Such room temperature bonding apparatus can separately set a plurality of substrates in a cassette chamber at different timing.

The room temperature bonding apparatus according to the present invention further includes: a plurality of cassettes that is arranged transferably to/from insides of the plurality of cassette chambers. Each of the plurality of cassettes is formed with a plurality of shelves on which the second substrate, the first substrate, or the bonded substrate is arranged. Such room temperature bonding apparatus can transfer a plurality of sets of the two substrates into a cassette chamber along with cassettes, and transfer the bonding substrate along with a cassette into a next processing step (processing step of dicing, etching, or further bonding a substrate). Such room temperature bonding apparatus can shorten a tact time, is high efficient, and produces a large production quantity per unit time, and is therefore preferable for mass production.

The room temperature bonding apparatus according to the present invention further includes: an elastic guide that is integrally bonded to the second sample stage. The second driving device supports and drives the elastic guide to thereby drive the second sample stage. Preferably, the elastic guide is elastically deformed such that the second sample stage does not come into contact with the carriage support table when the first substrate and the second substrate are not in contact with each other, and the second sample stage comes into contact with the carriage support table when the first substrate and the second substrate are brought into press contact with each other.

The second sample stage preferably moves in the second direction with sliding on the carriage support table.

A room temperature bonding apparatus according to the present invention includes: a first driving device that drives in a first direction a first stage supporting a first sample stage holding a first substrate; a second driving device that drives in a second direction not parallel to the first direction a second sample stage holding a second substrate; a carriage support table that supports the second sample stage in the first direction when the second substrate and the first substrate are brought into press contact with each other; and a mechanical lock mechanism that mechanically fixes a cartridge, which fixes the second substrate, to the second sample stage. When the room temperature bonding apparatus brings the first substrate and the second substrate into press contact with each other, it can reduce a load imposed on the second driving device, and impose a larger load exceeding a withstand load of the second driving device on the first substrate and the second substrate. Further, the room temperature bonding apparatus can removably supports the second substrate to the second sample stage without applying electromagnetic force to the second substrate. For this reason, the room temperature bonding apparatus can impose the large load on a substrate that cannot be applied with electromagnetic force.

The room temperature bonding apparatus further includes: a bonding chamber that arranges the first sample stage and the second sample stage inside; a vacuum pump that exhausts gas from the inside of the bonding chamber through an exhaust port formed in the bonding chamber to generate a vacuum ambient inside the bonding chamber; a gate valve that opens or closes between a load lock chamber and the bonding chamber; a transfer device that transfers the first substrate and the second substrate from the load lock chamber to the bonding chamber through the gate valve; and a surface cleaning device that, when a first surface facing to the second substrate of the first substrate and a second surface facing to the first substrate of the second substrate are separated from each other, irradiates a region between the first surface and the second surface with particles emitted from one site in the vacuum ambient. A centerline of a beam of the particles faces to a region excluding the exhaust port and the gate valve of an inner surface of the bonding chamber. Such room temperature bonding apparatus further prevents contamination of the vacuum pump and contamination of the gate valve to thereby increase the lifetime thereof.

A room temperature bonding apparatus according to the present invention includes: a first driving device that drives in a first direction a first stage supporting a first sample stage holding a first substrate; a second driving device that drives in a second direction not parallel to the first direction a second sample stage holding a second substrate; a carriage support table that, when the second substrate and the first substrate are brought into press contact with each other, supports the second sample stage in the first direction; a light source that emits light; and a camera that images an image on the basis of reflected light of the light reflected by an alignment mark that is patterned on the first substrate or the second substrate. The carriage support table is formed with an observation window that transmits the light and the reflected light. When the room temperature bonding apparatus brings the first substrate and the second substrate into press contact with each other, it can reduce a load imposed on the second driving device, and impose a larger load exceeding a withstand load of the second driving device on the first substrate and the second substrate. Further, the room temperature bonding apparatus drives the second sample stage on the basis of the image, and thereby can align the first substrate and the second substrate with each other such that the first substrate and the second substrate are bonded to each other at room temperature as designed.

The room temperature bonding apparatus according to the present invention includes: a bonding chamber that arranges the first sample stage and the second sample stage inside; a vacuum pump that exhausts gas from the inside of the bonding chamber through an exhaust port formed in the bonding chamber to generate a vacuum ambient inside the bonding chamber; a gate valve that opens or closes between a load lock chamber and the bonding chamber; a transfer device that transfers the first substrate and the second substrate from the load lock chamber to the bonding chamber through the gate valve; and a surface cleaning device that, when a first surface facing to the second substrate of the first substrate and a second surface facing to the first substrate of the second substrate are separated from each other, irradiates a region between the first surface and the second surface with particles emitted from one site in the vacuum ambient. A centerline of a beam of the particles faces to a region excluding the exhaust port and the gate valve of an inner surface of the bonding chamber. When the room temperature bonding apparatus brings the first substrate and the second substrate into press contact with each other, it can reduce the load imposed on the second driving device, and impose the larger load exceeding a withstand load of the second driving device on the first substrate and the second substrate. Such room temperature bonding apparatus further prevents the contamination of the vacuum pump and the contamination of the gate valve to increase the lifetime thereof.

When the room temperature bonding apparatus according to the present invention brings the first substrate and the second substrate into press contact with each other, it can reduce the load imposed on the second driving device, and impose the larger load exceeding the withstand load of the second driving device on the first substrate and the second substrate. Further, the room temperature bonding apparatus according to the present invention can more uniformly impose the larger load on the bonding surfaces of the first substrate and the second substrate.

BRIEF DESCRIPTION OF THE DRAWINGS

FIG. 18 is a flowchart illustrating an operation of continuously manufacturing the room temperature bonding substrate with use of the room temperature bonding apparatus according to the present invention;

FIG. 19 is a flowchart illustrating an operation of continuously manufacturing the room temperature bonded substrate with use of the room temperature bonding apparatus according to the present invention;

BEST MODE FOR CARRYING OUT THE INVENTION

Figure 1:
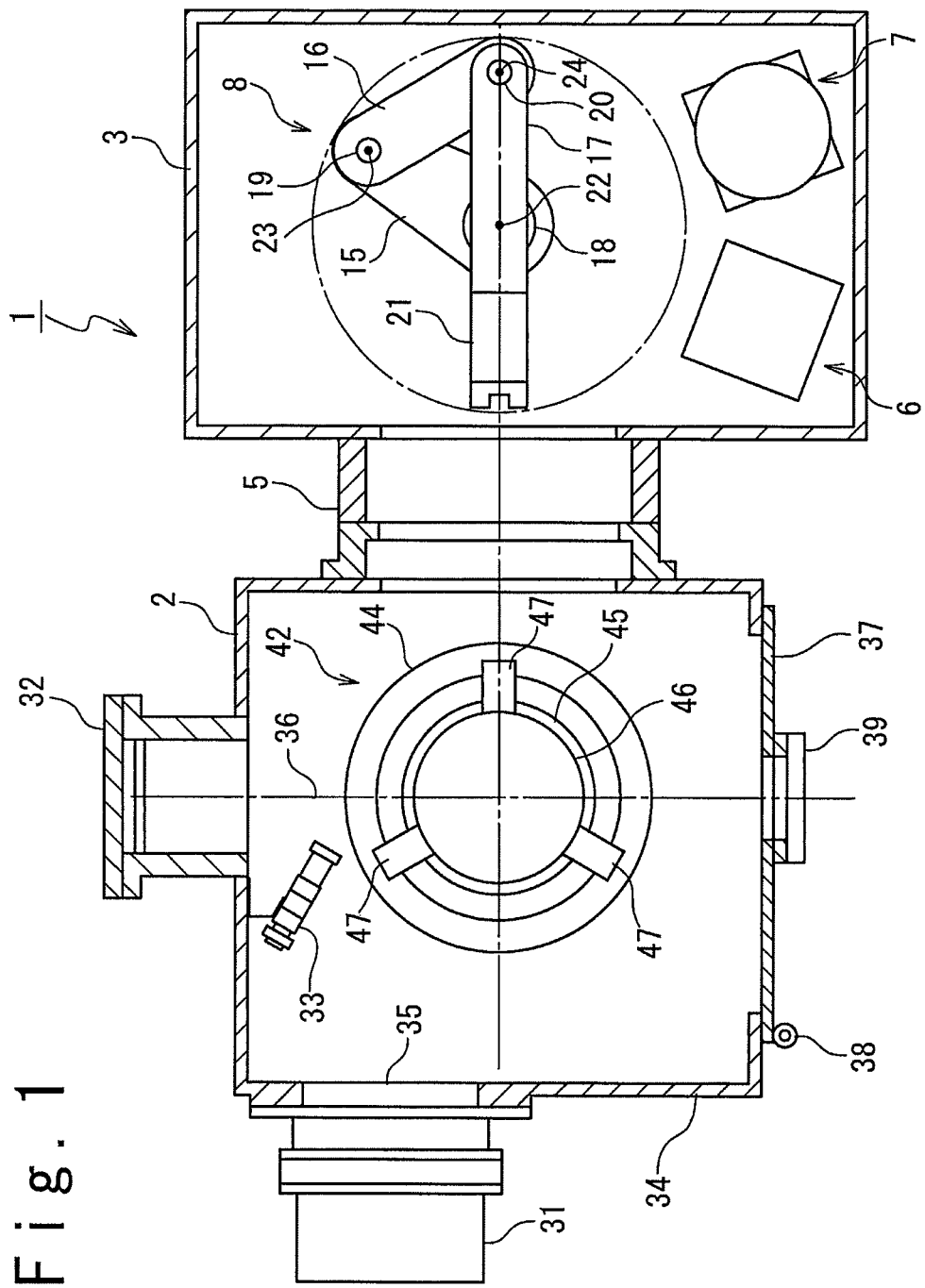
FIG. 1 is a cross-sectional view illustrating an embodiment of a room temperature bonding apparatus according to the present invention.

Referring to the drawings, an embodiment of a room temperature bonding apparatus according to the present invention will be described. A room temperature bonding apparatus 1 includes, as illustrated in FIG. 1, a bonding chamber 2, and a load lock chamber 3. The bonding chamber 2 and load lock chamber 3 are formed in container shapes of which insides are hermetically sealed from an environment. The room temperature bonding apparatus 1 further includes a gate valve 5. The gate valve 5 is installed between the bonding chamber 2 and the load lock chamber 3, and closes or opens a gate that makes a connection between the insides of the bonding chamber 2 and load lock chamber 3.

The load lock chamber 3 includes a first cassette table 6, a second cassette table 7, and a transfer device 8 inside. On the first and second cassette tables 6 and 7, cassettes used for placing substrates are arranged. Note that, in the load lock chamber 3, three or more such cassette tables may be arranged.

The load lock chamber 3 further includes a vacuum pump (not shown) and a lid (not shown). The vacuum pump exhausts gas from the inside of the load lock chamber 3. As the vacuum pump, there is exemplified a turbo molecular pump in which a plurality of internal metal blades flicks gas molecules to thereby exhaust the gas. The lid closes or opens a gate that makes a connection between an outside and inside of the load lock chamber 3. The gate is larger in size than the cassette arranged on the first or second cassette table 6 or 7.

The transfer device 8 includes a first arm 15, a second arm 16, a third arm 17, a first joint 18, a second joint 19, and a third joint 20. The first, second, and third arms 15, 16, and 17 are respectively formed in a rod-like shape. The first joint 18 is supported by a floor board of the load lock chamber 3, and supports the first arm 15 rotatably around a rotary shaft 22. The rotary shaft 22 is parallel to a vertical direction. The second joint 19 is supported by the first joint 18, and supports the second arm 16 rotatably around a rotary shaft 23. The rotary shaft 23 is parallel to a vertical direction, i.e., parallel to the rotary shaft 22. The third joint 20 is supported by the second joint 19, and supports the third arm 17 rotatably around a rotary shaft 24. The rotary shaft 24 is parallel to the vertical direction, i.e., parallel to the rotary shaft 23. The third arm 17 includes a click 21 at one end opposed to the other end at which the third arm 17 is bonded to the third joint 20. The click 21 is used to grip a substrate placed in the cassette arranged on the first or second cassette table 6 or 7.

The transfer device 8 further includes a lifting mechanism (not shown) and a stretching mechanism (not shown). The lifting mechanism moves up and down the first arm 15 to move up and down a substrate gripped by the click 21 on the basis of user's operation. The stretching mechanism controls the first, second, and third joints 18, 19, and 20 to translate the third arm 17 parallel to a longer direction of the third arm 17.

The transfer device 8 transfers the substrate from the load lock chamber 3 to the bonding chamber 2 through the gate valve 5, or from the bonding chamber 2 to the load lock chamber 3 through the gate valve 5.

The bonding chamber 2 includes a vacuum pump 31, an ion gun 32, and an electron gun 33. The bonding chamber 2 is formed with an exhaust port 35 in a part of a wall 34 forming the container. The vacuum pump 31 is arranged outside the bonding chamber 2, and exhausts gas from the inside of the bonding chamber 2 through the exhaust port 35. As the vacuum pump 31, there is exemplified a turbo molecular pump in which a plurality of internal metal blades flicks gas molecules to thereby exhaust the gas. The ion gun 32 is arranged with facing to one irradiation direction 36, and emits accelerated charged particles in the irradiation direction 36. As the charged particles, argon ions are exemplified. The ion gun 32 may be replaced by another surface cleaning device that cleans a surface of substrates. As the surface cleaning device, a plasma gun, a fast atomic beam source, or the like is exemplified. The electron gun 33 is arranged with facing to an object to be irradiated with the charged particles by the ion gun 32, and emits accelerated electrons toward the object.

The wall 34 is formed with a door 37 in a part thereof. The door 37 includes a hinge 38. The hinge 38 supports the door 37 rotatably with respect to the wall 34. The wall 34 is further formed with a window 39 in a part thereof. The window 39 is formed of a material that does not transmit gas but transmit visible light. The window 39 may be arranged anywhere within the wall 34 if it is arranged such that a user can view the object irradiated with the charged particles by the ion gun 32, or a bonding state from the outside of the bonding chamber 2.

Figure 2:
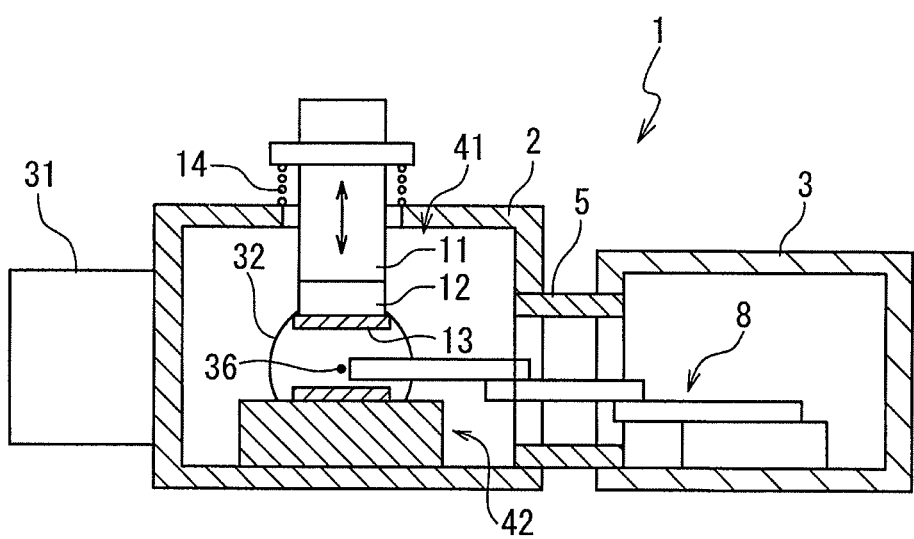
FIG. 2 is a cross-sectional view illustrating the embodiment of the room temperature bonding apparatus according to the present invention.

The bonding chamber 2 further includes, as illustrated in FIG. 2, an upper substrate support portion 41 and a lower substrate support portion 42 inside. The upper substrate support portion 41 includes an upper stage 11, an angle adjustment mechanism 12, an upper sample stage 13, and an upper stage driving device 14. The upper stage 11 is supported so as to be parallel movable in a vertical direction with respect to the bonding chamber 2. The angle adjustment mechanism 12 supports the upper sample stage 13 to the upper stage 11 so as to be able to change a direction of the upper sample stage 13. The upper sample stage 13 includes a dielectric layer at a lower end thereof, and applies a voltage between the dielectric layer and a substrate to suck the substrate to the dielectric layer by electrostatic force. The upper stage driving device 14 translates the upper stage 11 in a vertical direction with respect to the bonding chamber 2 on the basis of the user's operation. The lower substrate support portion 42 supports a substrate to an upper end thereof.

When a substrate supported by the upper substrate support portion 41 and a substrate supported by the lower substrate support portion 42 are separated from each other, the ion gun 32 is directed toward a space between the substrate supported by the upper substrate support portion 41 and the substrate supported by the lower substrate support portion 42, and also directed toward a part of an inner surface of the wall 34 of the bonding chamber 2. That is, the irradiation direction 36 of the ion gun 32 passes between the substrate supported by the upper substrate support portion 41 and the substrate supported by the lower substrate support portion 42, and intersects with the part of the inner surface of the wall 34 of the bonding chamber 2.

Figure 3:
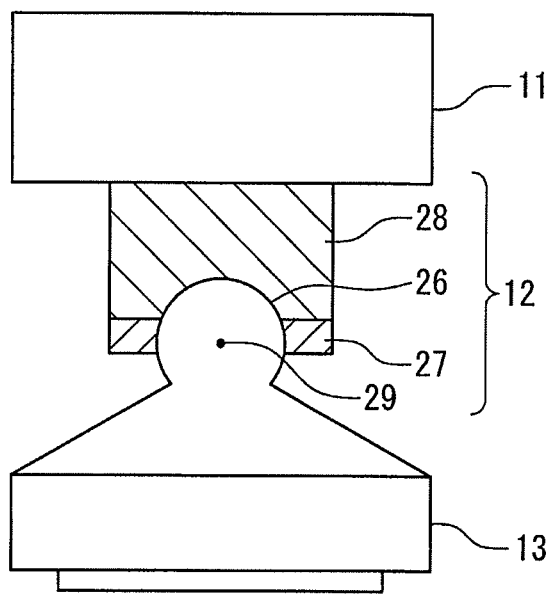
FIG. 3 is a cross-sectional view illustrating an angle adjustment mechanism.

FIG. 3 illustrates the angle adjustment mechanism 12. The angle adjustment mechanism 12 includes a ball flange 26, fixed flange 27, and ball seat 28. The ball flange 26 is substantially composed of a support portion and a flange portion. The support portion is bonded to the upper sample stage 13. The flange portion is formed in a spherical shape centering on a point 29. The fixed flange 27 is bonded to the flange portion of the ball flange 26 by caulking and fixing. The ball seat 28 is formed with a ball seat surface that comes into close contact with the flange portion of the ball flange 26. The ball seat is further bonded to the upper stage 11, and bonded to the fixed flange 27 with a fastening tool exemplified by a bolt such that the ball seat surface comes into close contact with the flange portion of the ball flange 26.

Figure 4:
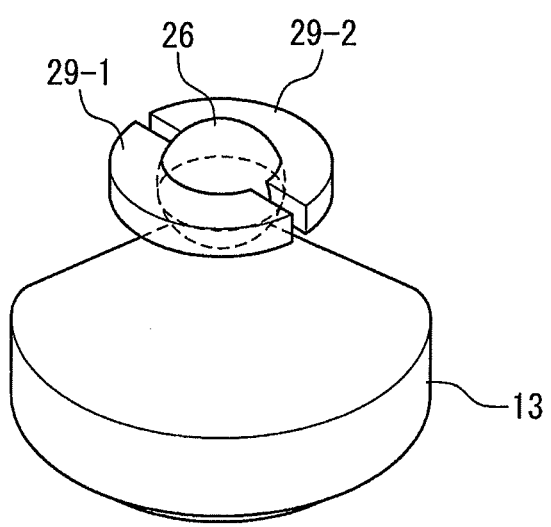
FIG. 4 is a perspective view illustrating the angle adjustment mechanism.

FIG. 4 illustrates the fixed flange 27. The fixed flange 27 includes split rings 29-1 and 29-2. The split rings 29-1 and 29-2 are respectively formed as parts of a ring. The split rings 29-1 and 29-2 are arranged such that an inside of the ring comes into contact with the flange portion of the ball flange 26, and fastened with bolts (not shown) to be thereby bonded to the flange portion of the ball flange 26.

Figure 5:
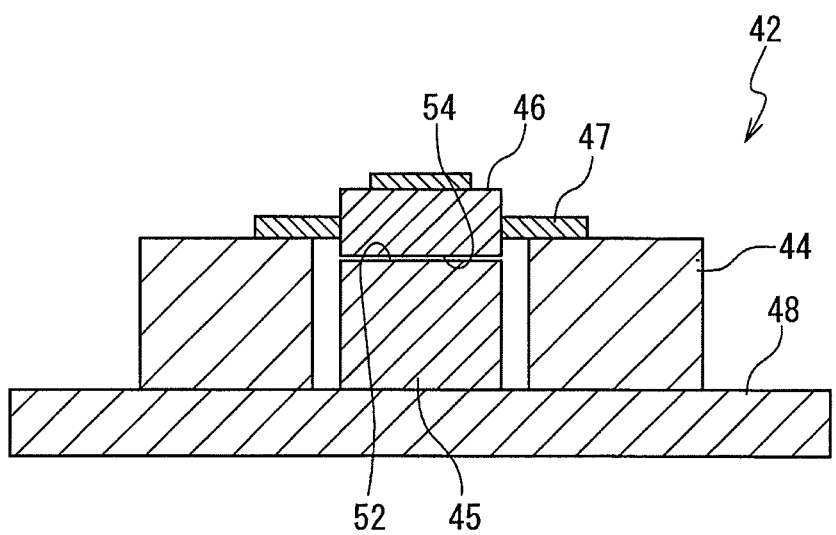
FIG. 5 is a cross-sectional view illustrating a lower substrate support portion.

FIG. 5 illustrates the lower substrate support portion 42 in detail. The lower substrate support portion 42 includes a positioning stage 44, a carriage support table 45, a lower sample stage 46, and an elastic guide 47. The positioning stage 44 is supported by a bottom plate 48 of the bonding chamber 2. The carriage support table 45 is formed, for example, cylindrically, and supported by the bottom plate 48 of the bonding chamber 2. The carriage support table 45 has a smooth support surface 52 at an upper end of the cylinder. The support surface 52 is perpendicular to the vertical direction.

The lower sample stage 46 is formed, for example, cylindrically. The lower sample stage 46 has a smooth support surface 54 at a lower end of the cylinder. A surface on a side opposite to the support surface 54 of the lower sample stage 46 is fabricated with high accuracy (e.g., parallelism is 10 μm or less) so as to be parallel to the support surface 54. The elastic guide 47 is formed of an elastic body, and integrally bonded to a side surface of the lower sample stage 46. The positioning stage 44 parallel movably supports the elastic guide 47 in a horizontal direction such that the support surface 54 of the lower sample stage 46 does not come into contact with the support surface 52 of the carriage support table 45. At this time, the support surfaces 54 and 52 are separated from each other by approximately 100 μm. Further, when the lower sample stage 46 is pressed vertically downward by the upper substrate support portion 41, the elastic guide 47 is elastically deformed such that the support surface 54 of the lower sample stage 46 comes into contact with the support surface 52 of the carriage support table 45. Further, the positioning stage 44 translates the elastic guide 47 in a horizontal direction, and rotationally moves the elastic guide 47 around a rotary shaft parallel to a vertical direction.

Regarding such a lower substrate support portion 42, when the lower sample stage 46 is pressed vertically downward by the upper substrate support portion 41, the carriage support table 45 supports the lower sample stage 46 by application of a pressing load to the elastic guide supporting the lower sample stage 46. For this reason, the room temperature bonding apparatus 1 can apply a large load, which exceeds a withstand load of the positioning stage 44, to the substrates mounted on the upper substrate support portion 41 and the lower substrate support portion 42 without applying a large load to the positioning stage 44.

Note that, regarding the lower substrate support portion 42, the positioning stage 44 and the elastic guide 47 may be replaced by another positioning mechanism. In this case, the carriage support table 45 supports the lower sample stage 46 with the support surface 52 being in contact with the support surface 54 of the lower sample stage 46. Such a positioning mechanism translates the lower sample stage 46 in a direction parallel to a horizontal direction, and rotationally moves the lower sample stage 46 around a rotary shaft parallel to a vertical direction on the basis of the user's operation. At this time, the lower sample stage 46 moves with sliding on the support surface 52 of the carriage sample stage 45.

Figure 6:
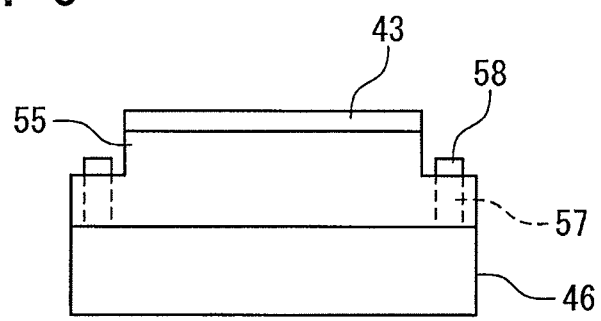
FIG. 6 is a cross-sectional view illustrating a substrate held by the lower substrate support portion.

FIG. 6 illustrates a substrate to be supported by the lower sample stage 46. A substrate 43 is bonded to a cartridge 55.

Figure 7:
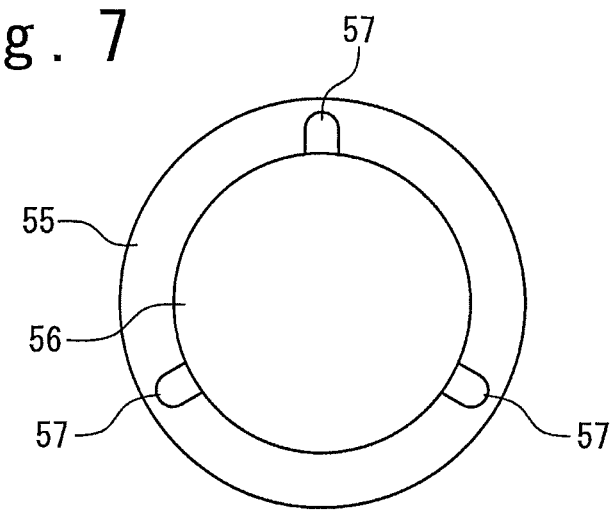
FIG. 7 is a cross-sectional view illustrating a cartridge.

FIG. 7 illustrates the cartridge 55. The cartridge 55 is formed in a substantially disk-like shape, and formed with a bonding plane 56 and a plurality of holes 57. The bonding plane 56 is flatly formed. The substrate 43 is fixed onto the bonding plane 56 of the cartridge 55 with use of a wafer tape (not shown). The plurality of holes 57 are formed outside the bonding plane 57.

Figure 8:
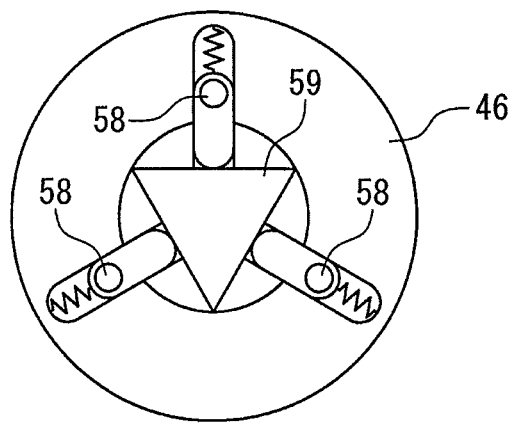
FIG. 8 is a plan view illustrating a lower sample stage.

FIG. 8 illustrates the lower sample stage 46. The lower sample stage 46 holds the substrate 43 by holding the cartridge 55 on the basis of a mechanical lock mechanism. The lower sample stage 46 is formed in a substantially disk-like shape, and includes a plurality of pins 58 and a cam 59. The plurality of pins 58 are respectively formed in a rod-like shape, and supported by the lower sample stage 46 parallel movably in a radial direction of the disk of the lower sample stage 46. The cam 59 is arranged at the center of the disk of the lower sample stage 46, and rotated by a rotating mechanism (not shown; e.g., motor) to drive the plurality of pins 58 outward. That is, regarding the lower sample stage 46, the substrate 43 is arranged such that the plurality of pins 58 falls into the plurality of holes 57 of the cartridge 55, and the cam 59 is rotated by the user's operation to thereby fix the substrate 43.

A substrate to be held by the upper sample stage 13 is bonded to the cartridge 55 in the same manner as for the substrate 43. Further, the upper sample stage 13 is configured in the same manner as for the lower sample stage 46. That is, the upper sample stage 13 is formed in a substantially disk-like shape, and includes a plurality of pins and a cam. The plurality of pins are respectively formed in a rod-like shape, and supported by the upper sample stage 13 parallel movable in a radial direction of a disk of the upper sample stage 13. The cam is arranged at the center of the disk of the upper sample stage 13, and rotated to thereby drive the plurality of pins outward. That is, regarding the upper sample stage 13, the substrate 43 is arranged such that the plurality of pins falls into the plurality of holes 57 of the cartridge 55, and the cam is rotated by the user's operation to thereby fix the substrate 43.

The sample stage provided with such a mechanical lock mechanism can hold the substrate 43 without use of electromagnetic force, and is effective to hold the substrate 43 to which application of electromagnetic force is unfavorable.

Figure 9:
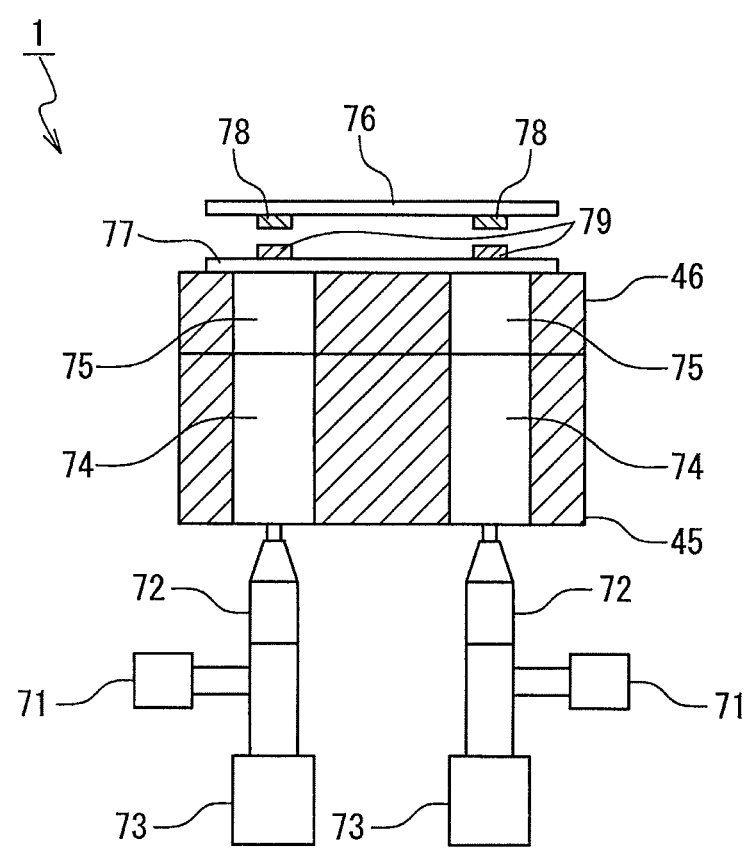
FIG. 9 is a cross-sectional view illustrating an alignment device.

As illustrated in FIG. 9, the room temperature bonding apparatus 1 further includes an alignment device 70. The alignment device 70 includes an infrared illumination 71, a lens 72, and a camera 73. In this case, the carriage support table 45 is formed with a transparent portion 74. The transparent portion 74 is formed of a material that is transparent to infrared light irradiated by the infrared illumination 71. Further, the lower sample stage 46 is formed with a transparent portion 75. The transparent portion 75 is formed of a material that is transparent to the infrared light irradiated by the infrared illumination 71, and arranged adjacent to the transparent portion 74 of the lower sample stage 46. Further, when the substrate is bonded to the cartridge 55, the cartridge 55 is similarly formed with a transparent portion. The transparent portion is formed of a material that is transparent to the infrared light irradiated by the infrared illumination 71, and arranged adjacent to the transparent portion 75 of the lower sample stage 46.

The infrared illumination 71, the lens 72, and the camera 73 are fixed to the bonding chamber 2. The infrared illumination 71 generates the infrared light that transmits a semiconductor. As a wavelength of the infrared light, a wavelength of 1 μm or more is exemplified. The lens 72 changes a direction of the infrared light generated by the infrared illumination 71 to a vertical direction to irradiate a substrate 76 held by the upper substrate support portion 41 or a substrate 77 held by the lower substrate support portion 42 with the infrared light through the transparent portions 74 and 75. The lens 72 further transmits reflected light of the infrared light, which reflects the substrate 76 to the camera 73, and transmits reflected light of the infrared light, which reflects the substrate 77, to the camera 73. The camera 73 creates an image of a part of the substrate 76 or 77 on the basis of the reflected light transmitted through the lens 72.

The substrate 76 is formed with an alignment mark 78 on a part of a surface facing to the substrate 77. The substrate 77 is formed with an alignment mark 79 on a surface facing to the substrate 76. The substrate 77 is supported by the lower sample stage 46 such that the alignment mark 79 is arranged with being aligned with the transparent portions 74 and 75. The alignment marks 78 and 79 are designed so as to be arranged with just facing to each other when the substrates 76 and 77 are bonded to each other at room temperature as designed. The alignment marks 78 are formed at a plurality of sites of the substrates 76, and those 79 are formed at a plurality of sites of the substrate 77.

In this case, the cartridge 55, the lower sample stage 46, and the carriage support table 45 are formed such that the alignment mark 79 of the substrate 77 is photographed by the alignment device 70. That is, when the cartridge 55 is bonded to the substrate 77, it is formed with a plurality of transparent portions respectively corresponding to the plurality of sites at which the plurality of alignment marks 79 is arranged. When the lower substrate support portion 42 holds the substrate 77, the lower sample stage 46 are formed with a plurality of the transparent portions 75 respectively corresponding to the plurality of sites at which the plurality of alignment marks 79 is arranged. When the lower substrate support portion 42 holds the substrate 77, the carriage support table 45 is formed with a plurality of the transparent portions 74 respectively corresponding to the plurality of sites at which the plurality of alignment marks 79 is arranged.

Figure 10:
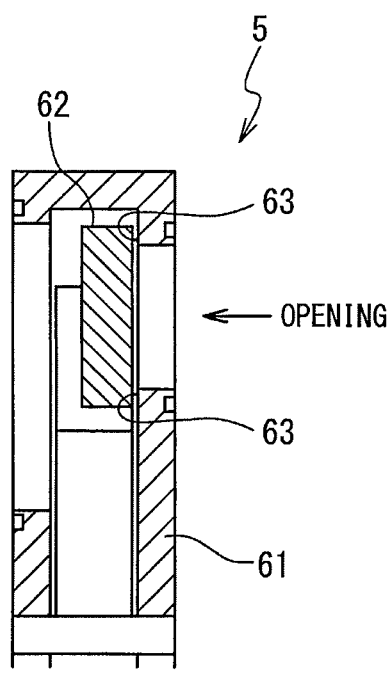
FIG. 10 is a cross-sectional view illustrating a gate valve.

FIG. 10 illustrates the gate valve 5. The gate valve 5 includes a gate 61 and a door 62. The gate 61 forms an opening that makes a connection between the insides of the bonding chamber 2 and the load lock chamber 3, and has a sealing surface 63 around the opening. The door 62 is moved by a mechanism on the basis of the user's operation, and closes the opening of the gate 61 with being in close contact with the sealing surface 63, or opens the opening of the gate 61 with being separated from the opening of the gate 61.

The room temperature bonding apparatus 1 is manufactured such that the gate valve 5 and vacuum pump 31 are arranged so as not to be strongly exposed to the particles emitted from the ion gun 32, and so as not to be strongly exposed to particles that are flicked from the surface of the wall 34, the surfaces of internal objects and the surfaces of the substrates by the particles emitted from the ion gun 32.

If the gate valve 5 is strongly exposed to the particles emitted from the ion gun 32, or exposed to the particles that are flicked from the surfaces of the substrates by the particles emitted from the ion gun 32, a contamination film due to the particles is formed around the sealing surface 63. The contamination film is peeled off by the opening and closing of the gate valve 5; then a contamination material intrudes into the sealing surface 63; and consequently it becomes impossible to hermetically seal the insides of the bonding chamber 2 and the load lock chamber 3. The room temperature bonding apparatus 1 as described can prevent the contamination of the sealing surface 63 of the gate valve 5 to increase a lifetime thereof.

Regarding the vacuum pump 31, if the exhaust port 35 is strongly exposed to the particles emitted from the ion gun 32, or exposed to the particles that are flicked from the surface of the wall 34, the surfaces of internal objects, and the surfaces of the substrates by the particles emitted from the ion gun 32, the plurality of internal metal blades are damaged or formed with a contamination film. The damage of the blades, or solidification and deposition of the contamination film may cause a reduction in exhaust performance of the vacuum pump 31. Also, if the contamination film is peeled off, the vacuum pump 31 may suck it to break down the vacuum pump 31. The room temperature bonding apparatus 1 as described can prevent the damage and contamination of the blades of the vacuum pump 31 to increase the lifetime thereof.

Figure 11:
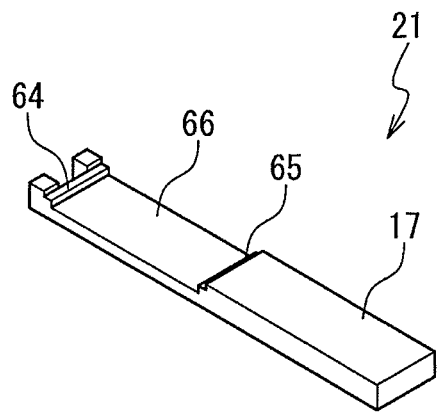
FIG. 11 is a perspective view illustrating a click of a transfer device.
Figure 12:
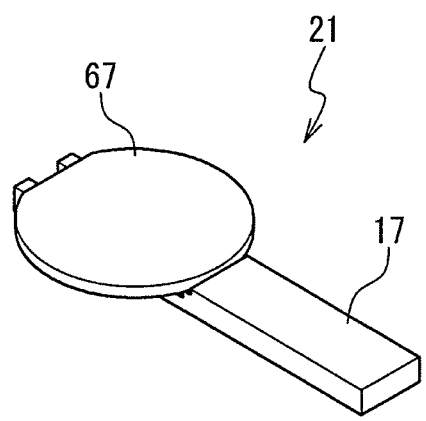
FIG. 12 is a perspective view illustrating the click of the transfer device, which grips a substrate.

FIG. 11 illustrates the click 21 of the transfer device 8. The click 21 is formed with support surfaces 64 and 65, and a non-support surface 66. The support surfaces 64 and 65 are formed so as to follow the same horizontal plane, and directed vertically upward. The non-support surface 66 is formed so as to follow another horizontal plane that is arranged on a vertically lower side than the horizontal plane that the support surfaces 64 and 65 follow, and arranged between the support surfaces 64 and 65. As illustrated in FIG. 12, the click 21 grips the substrate 67 such that the substrate 67 comes into contact with the support surfaces 64 and 65, and does not come into contact with the non-support surface 66. In this case, the click 21 can prevent the occurrence of defective bonding due to contamination of a bonding surface of the substrate 67 because the bonding surface is not in contact with the transfer device 8 even when the bonding surface to be bonded at room temperature by the room temperature bonding apparatus 1 faces upward or downward.

Figure 13:
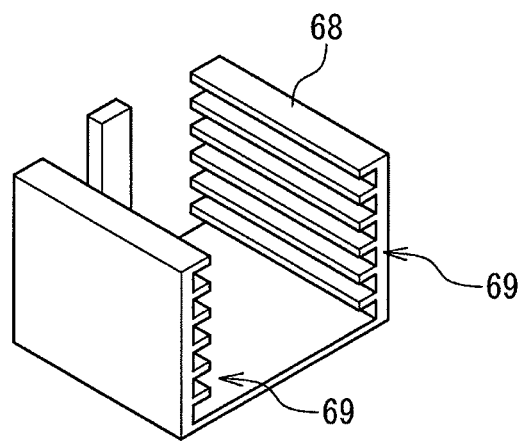
FIG. 13 is a perspective view illustrating a cassette.
Figure 14:
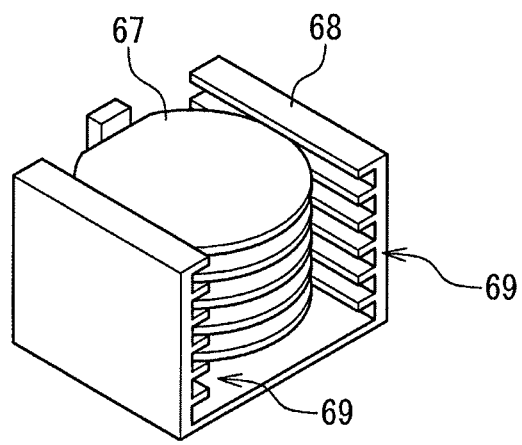
FIG. 14 is a perspective view illustrating the cassette arranged with substrates.

FIG. 13 illustrates the cassette to be arranged on the first or second cassette table 6 or 7. In the cassette 68, a plurality (e.g., 25) of shelves 69 are arranged horizontally to each other on each of opposed wall surfaces with being arrayed in a row in the vertical direction. As illustrated in FIG. 14, the cassette 68 arranges the substrates 67 such that the substrates 67 come into contact with the shelves 69 and the bonding surfaces of the substrates 67 do not come into contact with the cassette 68. In this case, the cassette 68 can prevent the occurrence of defective bonding due to contamination of the bonding surfaces of the substrates 67 because the bonding surfaces are not in contact with the cassette 68 even when the bonding surfaces to be bonded at room temperature by the room temperature bonding apparatus 1 face upward or downward.

Operations upon room temperature bonding with use of the room temperature bonding apparatus 1 includes an operation of correcting a direction of the upper sample stage, and an operation of room temperature bonding.

The operation of correcting a direction of the upper sample stage is performed from a state where the lower substrate support portion 42 is not provided with the lower sample stage 46 and the elastic guide 47. An operator first measures a direction of the upper sample stage 13. If a surface of the upper sample stage 13 on which a substrate is to be arranged is not parallel to the support surface 52 of the carriage support table 45, the operator uses the angle adjustment mechanism 12 to make an adjustment such that the surface of the upper sample stage 13 on which a substrate is to be arranged and the support surface 52 are parallelized with each other. That is, the operator caulks and fixes the ball flange 26 with the fixed flange 27 and fixes the fixed flange 27 to the ball seat 28 such that the surface of the upper sample stage 13 on which a substrate is to be arranged and the support surface 52 are parallelized with each other.

After the performance of such an angle adjustment, the operator attaches the lower sample stage 46 and elastic guide 47 to the lower substrate support portion 42. Then, the operator presses the upper substrate support portion 41 against the lower substrate support portion 42 such that the support surface 54 of the lower sample stage 46 comes into contact with the support surface 52 of the carriage support table 45. At this time, the operator measures a distribution of a load applied to the surface of the upper sample stage 13 on which a substrate is to be arranged, and a surface of the lower sample stage 46 on which a substrate is to be arranged, and checks that the load distribution is uniform.

Note that the operation of correcting a direction of the upper sample stage is replaced by another operation if the lower sample stage 46 is in contact with and supported by the support surface 52 of the carriage support table 45. In the operation, the operator first measures the direction of the upper sample stage 13. If the surface of the upper sample stage 13 on which a substrate is to be arranged, and the surface of the lower sample stage 46 on which a substrate is to be arranged are not parallel to each other, the operator uses the angle adjustment mechanism 12 to make an adjustment such that the surface of the upper sample stage 13 on which a substrate is to be arranged and the surface of the lower sample stage 46 on which a substrate is to be arranged are parallelized with each other. Note that, if the lower sample stage 46 holds a substrate, the operator can also make an adjustment such that the surface of the upper sample stage 13 on which a substrate is to be arranged is parallelized with a surface of the substrate held by the lower sample stage 46, which faces to the upper sample stage 13. That is, the operator caulks and fixes the ball flange 26 with the fixed flange 27 and fixes the fixed flange 27 to the ball seat 28 such that the surface of the upper sample stage 13 on which a substrate is to be arranged and the surface of the lower sample stage 46 on which a substrate is to be arranged are parallelized with each other. Then, the operator presses the upper substrate support portion 41 against the lower substrate support portion 42. At this time, the operator measures a distribution of a load applied to the surface of the upper sample stage 13 on which a substrate is to be arranged and the surface of the lower sample stage 46 on which a substrate is to be arranged, and checks that the load distribution is uniform.

Note that, if the upper sample stage 13 holds a substrate, a direction of a surface of the substrate, which faces to the lower sample stage 46, can also be measured, instead of the direction of the upper sample stage 13.

According to such an operation of correcting a direction of the upper sample stage, when a substrate on the upper sample stage 13 is bonded to a sample on the lower sample stage 46 at room temperature, a load can be more uniformly imposed on bonding surfaces of the substrate on the upper sample stage 13 and the substrate on the lower sample stage 46. As a result, when a plurality of devices are formed on a bonding substrate by the room temperature bonding, such an operation can improve an yield of the plurality of devices; improve reliability of the room temperature bonding by the room temperature bonding apparatus 1; and make the room temperature bonding apparatus 1 more practical. Further, according to such an operation, it is not necessary to make an adjustment such that the support surface 52 of the carriage support table 45 and the surface of the lower sample stage 46 on which a substrate is to be arranged are parallelized with each other, and the corresponding load distribution can be easily made more uniform. In this case, the room temperature bonding apparatus 1 is not required to include the mechanism that makes an adjustment such that the support surface 52 of the carriage support table 45 and the surface of the lower sample stage 46 on which a substrate is to be arranged are parallelized with each other, and therefore can be more easily manufactured.

Figure 15:
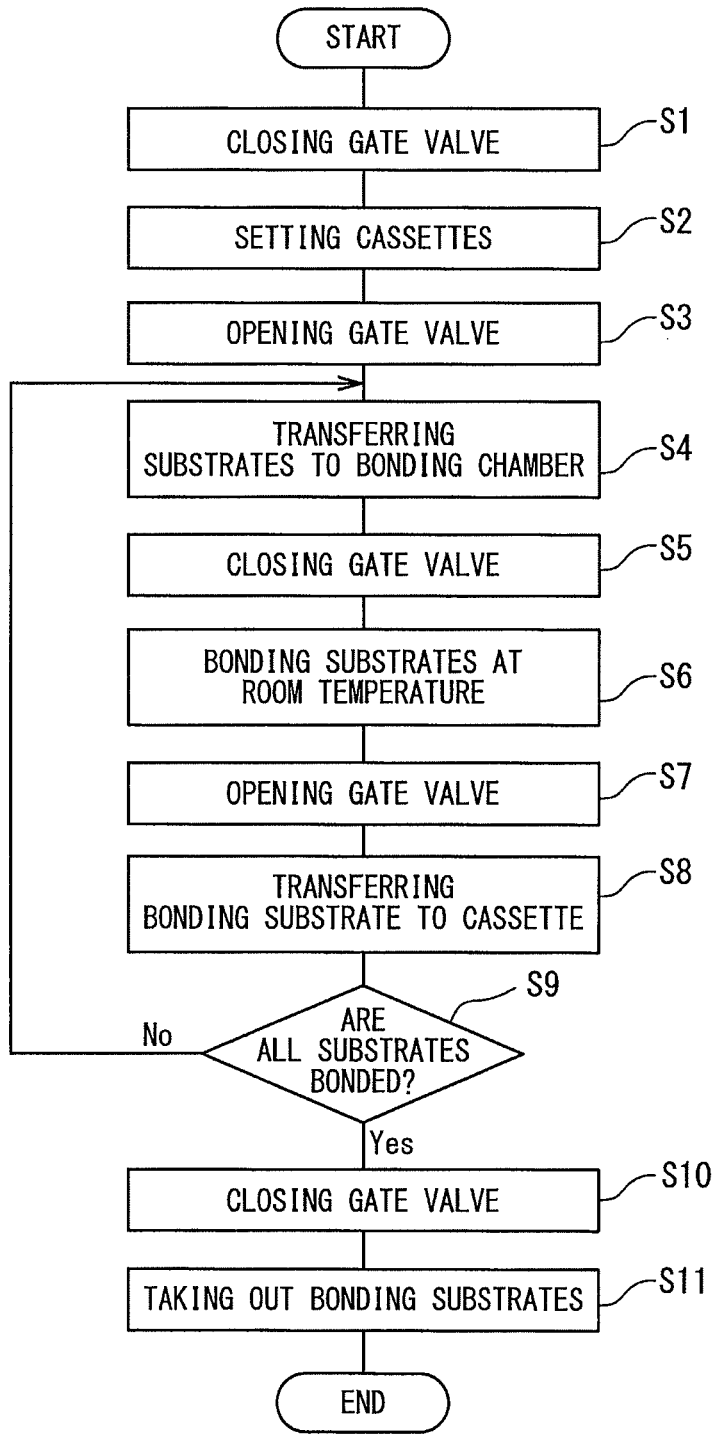
FIG. 15 is a flowchart illustrating an operation of bonding substrates at room temperature with use of the room temperature bonding apparatus according to the present invention.

FIG. 15 illustrates the operation of room temperature bonding. After the performance of the operation of correcting a direction of the upper sample stage, the operator first closes the gate valve 5 (Step S1) to generate a vacuum ambient inside the bonding chamber 2 with use of the vacuum pump 31 and an atmospheric pressure ambient inside the load lock chamber 3.

The operator loads a plurality of substrates in a cassette 68. The plurality of substrates is loaded in the cassette 68 such that their bonding surfaces face downward. The operator further loads in another cassette 68 a plurality of other substrates to be respectively bonded to the plurality of substrates. The plurality of other substrates is loaded in the cassette 68 such that their bonding surfaces face upward. The operator opens the lid of the load lock chamber 3 to arrange on the first cassette table 6 the cassettes 68 loaded with the substrates of which the bonding surfaces face downward, and on the second cassette table 7 the cassette 68 loaded with the substrates of which the bonding surfaces face upward (Step S2). If there are three or more cassette tables, they are also arranged. The operator closes the lid of the load lock chamber 3 to generate a vacuum ambient inside the load lock chamber 3, and then opens the gate valve 5 (Step S3)

The operator uses the transfer device 8 to set on the upper substrate support portion 41 one of the substrates loaded in the cassette 68 arranged on the first cassette table 6, and on the lower substrate support portion 42 one of the substrates loaded in the cassette 68 arranged on the second cassette table 7 (Step S4). The operator closes the gate valve 5 (Step S5).

After the operator has closed the gate valve 5, the substrate set on the upper substrate support portion 41 and the substrate set on the lower substrate support portion 42 are bonded at room temperature. That is, the operator uses the ion gun 32 to emit particles between the substrates set on the upper substrate support portion 41 and the lower substrate support portion 42 in a state where the substrates set on the upper substrate support portion 41 and the lower substrate support portion 42 are separated from each other. The particles are radiated on the substrates to remove oxidation products formed on surfaces of the substrates, and impurities attached to the surfaces of the substrates. The operator operates the upper stage driving device 14 of the upper substrate support portion 41 to move down the upper sample stage 13 vertically downward and bring the substrates set on the upper substrate support portion 41 and the lower substrate support portion 42 close to each other. The operator uses the alignment device 70 to image the alignment marks of the substrates set on the upper substrate support portion 41 and the lower substrate support portion 42 as an image. The operator operates, on the basis of the image, the positioning mechanism of the lower substrate support portion 42 to move a position of the substrate set on the lower substrate support portion 42 such that the substrates set on the upper substrate support portion 41 and the lower substrate support portion 42 are bonded to each other as designed. The operator operates the upper stage driving device 14 of the upper substrate support portion 41 to move down the upper sample stage 13 vertically downward and brings the substrate set on the upper substrate support portion 41 into contact with the substrate set on the lower substrate support portion 42. At this time, the elastic guide 47 of the lower substrate support portion 42 is elastically deformed, and the lower sample stage 46 of the lower substrate support portion 42 is supported by the carriage support table 45 with being in contact with the carriage support table 45. The substrates set on the upper substrate support portion 41 and the lower substrate support portion 42 are bonded to each other by the contact, and thereby one bonding substrate is produced.

According to such room temperature bonding, the operation of room temperature bonding is performed after the performance of the operation of correcting the direction of the upper sample stage 13, and thereby a load can be more uniformly imposed on the bonding surfaces of the substrates set on the upper and lower substrate support portions 41 and 42, resulting in improvement of an yield of the room temperature bonding. Further, according to such room temperature bonding, the lower sample stage 46 is supported by the carriage support table 45 with being in contact with the carriage support table 45, so that the positioning stage 44 can be prevented from being applied with a large load exceeding its withstand load, and a larger load can be uniformly imposed on the bonding surfaces of the substrates set on the upper substrate support portion 41 and the lower substrate support portion 42.

The operator moves up the upper sample stage 13 vertically upward, and then opens the gate valve 5 (Step S7). The operator uses the transfer device 8 to transfer the bonding substrate set on the lower substrate support portion 42 to an empty shelf in the cassette 68 arranged on the first cassette table 6 (Step S8). If there are three or more cassette tables, the operations in Steps S4 to S8 are repeatedly performed until all loaded substrates are bonded at room temperature (Step S9: Yes).

After all loaded substrates are bonded at room temperature (Step S9: Yes), the operator closes the gate valve 5 (Step S10), and supplies air into the load lock chamber 3 to generate an atmospheric pressure ambient inside the load lock chamber 3. The operator opens the lid of the load lock chamber 3 to take the bonding substrates along with the cassettes 68 out of the first cassette table 6 and the second cassette table 7 (Step S11).

According to such an operation, all of the bonding substrates can be transferred to a next processing step along with the cassette 68. Such a room temperature bonding method can shorten a tact time because an operation of reloading all of the bonding substrates into another cassette does not intermediate, resulting in high efficiency and large production quantity per unit time, and is therefore preferable for mass production.

Further, according to Step S2 in which the cassette 68 loaded with the substrates of which the bonding surfaces face downward is arranged on the first cassette table 6, and the cassette 68 loaded with the substrates of which the bonding surfaces face upward is arranged on the second cassette table 7, the transfer device 2 is not required to reverse the substrates inside the bonding chamber 2 or the load lock chamber 3. For this reason, the bonding chamber 2 and the load lock chamber 3 are not required to provide spaces for reversing the substrates insides, and therefore can be more compactly formed.

Further, the transfer device 8 is not required to provide a mechanism for reversing the substrates, and therefore can be more easily manufactured. As a result, the room temperature bonding apparatus 1 can be more compactly manufactured at lower cost.

Figure 16:
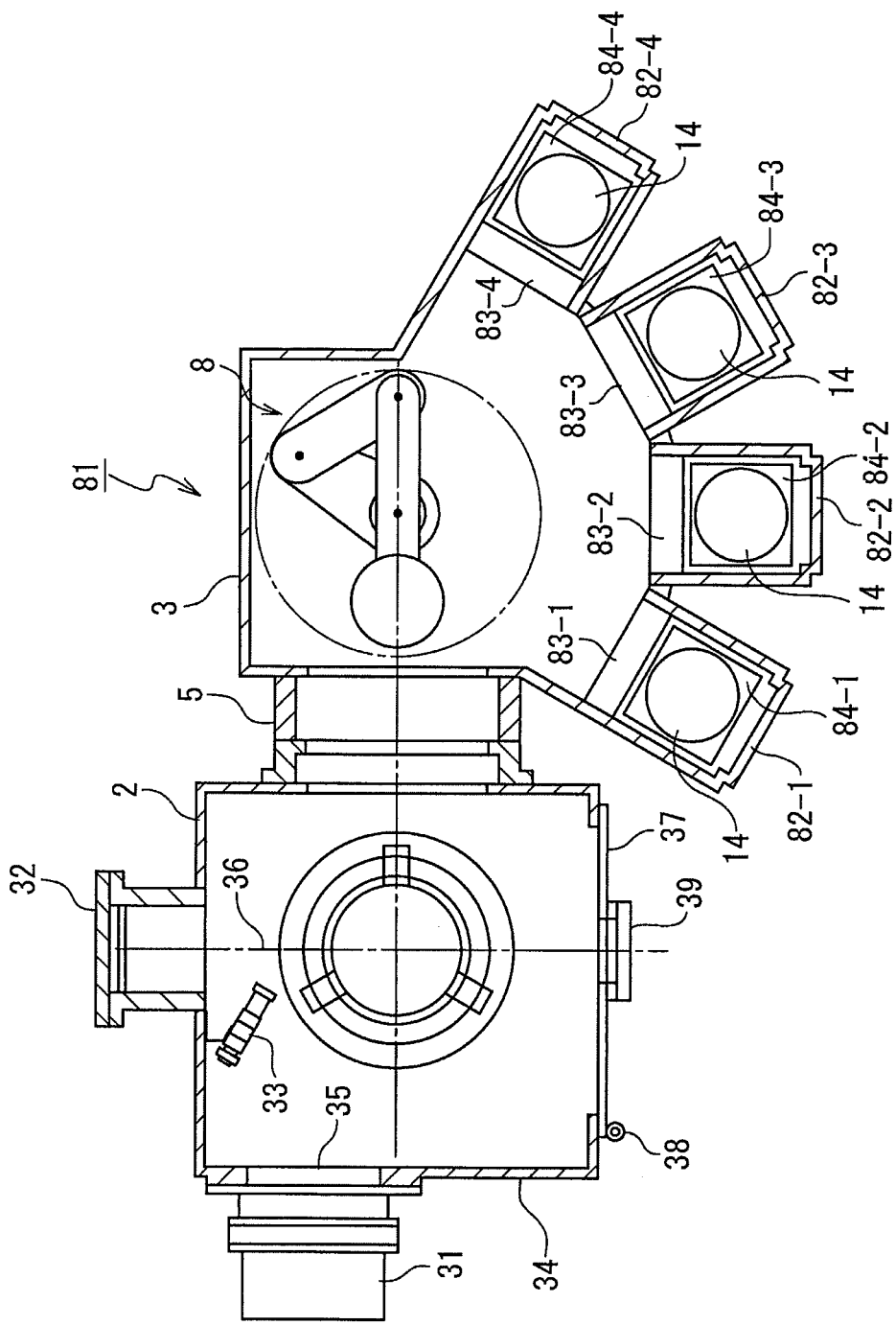
FIG. 16 is a cross-sectional view illustrating another embodiment of the room temperature bonding apparatus according to the present invention.

In another embodiment of the room temperature bonding apparatus according to the present invention, the load lock chamber 3 of the room temperature bonding apparatus 1 in the already-described embodiment does not include the first cassette table 6 and the second cassette table 7 inside, but includes a plurality of cassette chambers instead. That is, the room temperature bonding apparatus 81 includes, as illustrated in FIG. 16, the plurality of cassette chambers 82-1 to 82-4. Each of the cassette chambers 82-1 to 82-4 is a container that hermetically seals an inside thereof from an environment, and typically formed of stainless steel. The room temperature bonding apparatus 81 further includes a plurality of gate valves 83-1 to 83-4. The gate valve 83-$i$ ($i$=1, 2, 3, or 4) is installed between the load lock chamber 3 and the cassette chamber 82-$i$, and closes or opens a gate that makes a connection between insides of the cassette chamber 82-$i$ and the load lock chamber 3.

The cassette chamber 82-$i$ is arranged with a cassette 84-$i$. The cassette 84-$i$ is the same as that 68 in the already-described embodiment, and a case in which 25 horizontal shelves are arranged with being arrayed in a row in a vertical direction, which is used to place substrates on the shelves one by one.

The cassette chamber 82-*i* further includes a vacuum pump (not shown) and a lid (not shown). The vacuum pump exhausts gas from the inside of the cassette chamber 82-*i*. As the vacuum pump, there is exemplified a turbo molecular pump in which a plurality of internal metal blades flicks gas molecules to thereby exhaust the gas. The lid can be opened by closing the gate that makes a connection between an outside and an inside of the cassette chamber 82-*i*, and making the inside an atmospheric ambient. The lid is larger in size than the cassette 84-*i*.

The room temperature bonding apparatus 81 can execute operations upon room temperature bonding that makes three or more substrates into one substrate; upon room temperature bonding that makes two substrates into one substrate; and of continuously manufacturing such a bonding substrate.

In the operation upon room temperature bonding that makes three or more substrates into one substrate, the cassette chambers 82-1 to 82-3 among the plurality of cassette chambers 82-*i* are used. An operator first closes the gate valves 5, and 83-1 to 83-4, and uses the vacuum pump 31 to generate a vacuum ambient inside the bonding chamber 2, a vacuum ambient inside the load lock chamber 3, and an atmospheric pressure ambient inside the cassette chambers 82-1 to 82-4. The operator opens the lids of the cassette chambers 82-1 and 82-2 to arrange the cassette 84-1 loaded with 25 substrates in the cassette chamber 82-1 and the cassette 84-2 loaded with 25 substrates in the cassette chamber 82-2. The operator closes the lids of the cassette chambers 82-1 and 82-2 to generate a vacuum ambient inside the cassette chambers 82-1 and 82-2, and then opens the gate valves 5, 83-1, and 83-2.

The operator uses the transfer device 8 to mount one of the substrates loaded in the cassette 84-1 on the upper substrate support portion 41 and one of the substrates loaded in the cassette 84-2 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonded substrate mounted on the lower substrate support portion 42 to an empty shelf in the cassette 84-1. Such a bonding operation is repeatedly performed until all of the substrates loaded in the cassette 84-1 are bonded at room temperature.

During the performance of such bonding operations, the operator opens the lid of the cassette chamber 82-3 to arrange the cassette 84-3 loaded with 25 substrates in the cassette chamber 82-3. The operator closes the lid of the cassette chamber 82-3 to generate a vacuum ambient inside the cassette chamber 82-3.

After the substrates loaded in the cassette 84-1 and those loaded in the cassette 84-2 have been bonded to each other at room temperature, and the vacuum ambient has been generated inside the cassette chamber 82-3, the operator bonds the bonding substrates that are loaded in the cassette 84-1 and have been subjected to the room temperature bonding and the substrates loaded in the cassette 84-3 to each other at room temperature. That is, the operator uses the transfer device 8 to mount one of the bonding substrates loaded in the cassette 84-1 on the upper substrate support portion 41 and one of the substrates loaded in the cassette 84-3 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-1. Such a bonding operation is repeatedly performed until all of the substrates loaded in the cassette 84-1 are bonded at room temperature.

As described, in the operation upon room temperature bonding that makes three or more substrates into one substrate with use of the room temperature bonding apparatus 81, during the room temperature bonding of two substrate, a cassette loaded with substrates, which are subsequently subjected to the room temperature bonding, is set in a cassette chamber other than two cassette chambers respectively arranged with the two substrates. In the room temperature bonding apparatus 1 in the already-described embodiment, when three or more substrates are bonded to form one substrate at room temperature, a bonding substrate in which two substrates are bonded at room temperature is produced, and then an atmospheric pressure ambient and then again vacuum ambient should be generated inside the load lock chamber 3 in order to set a third substrate. The room temperature bonding apparatus 81 is not required to generate an atmospheric pressure ambient and then again a vacuum ambient inside the load lock chamber 3, and can therefore shorten a tact time to increase a unit time production quantity of substrates bonded at room temperature more than the room temperature bonding apparatus 1.

Figure 17:
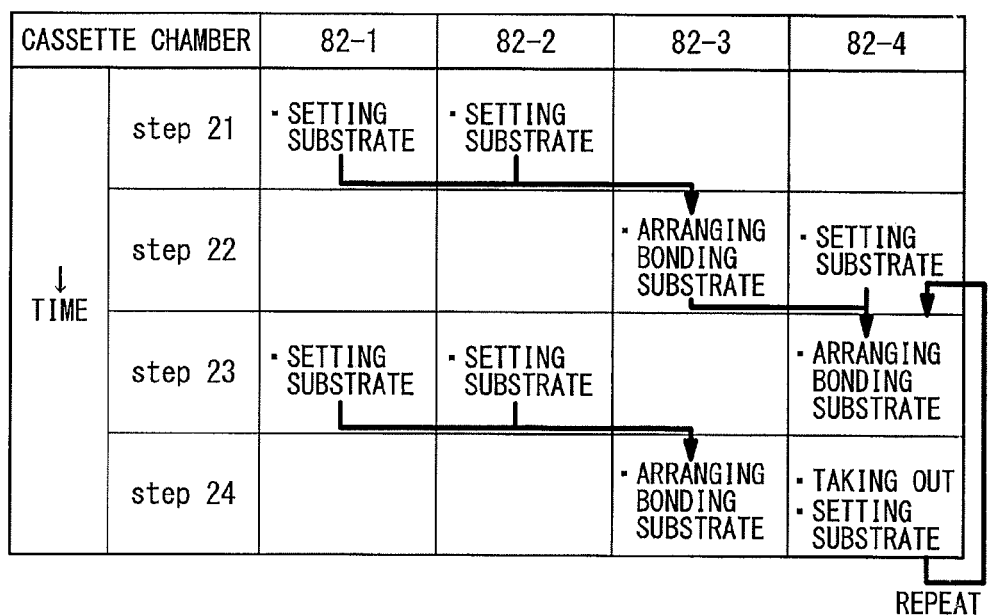
FIG. 17 is a flowchart illustrating an operation of continuously manufacturing a room temperature bonding substrate with use of the room temperature bonding apparatus according to the present invention.

Further, in the case where a product in which three or more substrates are bonded at room temperature is continuously manufactured, as a method for reducing a loss due to a waiting time for exhaust, which is a preparatory step prior to bonding, to achieve efficient manufacturing, there is the following method: In operations of the method, the cassette chambers 82-1 to 82-4 among the plurality of cassette chambers 82-*i* are used. In the operations for the case where the room temperature bonding that makes three substrates into one substrate is continuously performed, as illustrated in FIG. 17, an operator first closes the gate valves 5, and 83-1 to 83-4, and uses the vacuum pump 31 to generate a vacuum ambient inside the bonding chamber 2, a vacuum ambient inside the load lock chamber 3, and an atmospheric pressure ambient inside the cassette chambers 82-1 to 82-4. The operator opens the lids of the cassette chambers 82-1 and 82-2 to arrange the cassette 84-1 loaded with 25 substrates in the cassette chamber 82-1, and the cassette 84-2 loaded with 25 substrates in the cassette chamber 82-2. The operator closes the lids of the cassette chambers 82-1 and 82-2 to generate a vacuum ambient inside the cassette chambers 82-1 and 82-2, and then opens the gate valves 5, 83-1, and 83-2. (Step 21) the operator opens the lid of the cassette chamber 82-3 to arrange the empty cassette 84-3 in the cassette chamber 82-3. The operator closes the lid of the cassette chamber 82-3 to generate a vacuum ambient inside the cassette chamber 82-3, and then opens the gate valves 5 and 83-3.

The operator uses the transfer device 8 to mount one of the substrates loaded in the cassette 84-1 on the upper substrate support portion 41, and one of the substrates loaded in the cassette 84-2 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-3. Such a bonding operation is repeatedly performed until all of the substrates loaded in the cassette 84-1 are bonded at room temperature, and the bonded substrates are loaded on all of the shelves of the cassette 84-3 (Step 22).

During the performance of such bonding operations, the operator opens the lid of the cassette chamber 82-4 to arrange the cassette 84-4 loaded with 25 substrates in the cassette chamber 82-4. The operator closes the lid of the cassette chamber 82-4 to generate a vacuum ambient inside the cassette chamber 82-4 (Step 22).

After the substrates loaded in the cassette 84-1 and the substrates loaded in the cassette 84-2 have been bonded to each other at room temperature, and the vacuum ambient has been generated inside the cassette chamber 82-4, the operator bonds the bonding substrates that are loaded in the cassette 84-3 and have been subjected to the room temperature bonding and the substrates loaded in the cassette 84-4 at room temperature. That is, the operator uses the transfer device 8 to mount one of the bonding substrates loaded in the cassette 84-3 on the lower substrate support portion 42, and one of the substrates loaded in the cassette 84-4 on the upper substrate support portion 41. The operator closes the gate valve 5; bonds the substrates mounted on the upper and lower substrate support portion 41 and 42 at room temperature; and moves up the upper substrate support portion 41 to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-4. Such a bonding operation is repeatedly performed until all of the substrates loaded in the cassettes 84-3 and 84-4 are bonded to each other at room temperature (Step 23).

After the substrates loaded in the cassette 84-1 and the substrates loaded in the cassette 84-2 have been bonded to each other at room temperature, and the vacuum ambient has been generated inside the cassette chamber 82-4, the operator further generates an atmospheric pressure ambient inside the cassette chambers 82-1 and 82-2. The operator opens the lids of the cassette chambers 82-1 and 82-2 to arrange the cassette 84-1 loaded with 25 substrates and the cassette 84-2 loaded with 25 substrates, respectively. The operator closes the lids of the cassette chamber 82-1 and 82-2 to generate a vacuum ambient inside the cassette chambers 82-1 and 82-2, and then opens the gate valves 5, 83-1, and 83-2 (Step 23).

The operator uses the transfer device 8 to mount one of the substrates loaded in the cassette 84-1 on the upper substrate support portion 41, and one of the substrates loaded in the cassette 84-2 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-3. Such a bonding operation is repeatedly performed until all of the substrates loaded in the cassette 84-1 are bonded at room temperature and the bonding substrates are loaded on all of the shelves of the cassette 84-3 (Step 24).

During the performance of such bonding operations, the operator opens the lid of the cassette chamber 82-4 to take the cassette 84-4 loaded with the bonding substrates out of the cassette chamber 82-4, and then arranges another cassette 84-4 loaded with another set of 25 substrates in the cassette chamber 82-4. The operator closes the lid of the cassette chamber 82-4 to generate a vacuum ambient inside the cassette chamber 82-4 (Step 24).

After the substrates loaded in the cassette 84-1 and the substrates loaded in the cassette 84-2 have been bonded to each other at room temperature and the vacuum ambient has been generated inside the cassette chamber 82-4, the operator again bonds the bonding substrates that are loaded in the cassette 84-3 and have been subjected to the room temperature bonding and the substrates loaded in the cassette 84-4 at room temperature, and arranges the cassette 84-1 loaded with 25 substrates and the cassette 84-2 loaded with 25 substrates in the cassette chambers 82-1 and 82-2, respectively.

By repeatedly performing such operations, the operator can continuously perform the room temperature bonding that makes three substrates into one substrate, and continuously manufactures a product in which three substrates are bonded at room temperature. That is, such the room temperature bonding apparatus is not required to generate an atmospheric pressure ambient and then again a vacuum ambient inside the load lock chamber 3 upon continuous manufacturing of the product in which three substrates are bonded at room temperature. At the same time as the bonding process, a cassette loaded with substrates to be subsequently bonded at room temperature is set in a cassette chamber other than two cassette chambers respectively arranged with substrates being bonded. Therefore, the room temperature bonding apparatus can reduce a loss due to a waiting time for exhaust to shorten a tact time, and increase a unit time production quantity of substrates bonded at room temperature more than the room temperature bonding apparatus 1. Note that a cassette chamber to be arranged with the bonding substrates in Step 22 may be any one of the four cassette chambers, and in this case, a cassette chamber in which substrates to be subsequently bonded are set is one in which the bonding substrates are not arranged and also the cassettes mounted with the substrates to be bonded are not set in Step 21.

A cassette chamber to be arranged with the completed bonding substrates in Step 23 may be any one of the two cassette chambers in which the cassettes mounted with the substrates were set in Step 22. In this case, cassette chambers in which substrates to be subsequently newly bonded are set are the remaining two cassette chambers, excluding the two cassette chambers in which the cassettes mounted with the substrates were set in Step 22.

A cassette chamber to be arranged with the bonding substrates in Step 24 may be any one of the cassette chambers, excluding the cassette chamber arranged with the bonding substrates in Step 23, and in this case, a cassette chamber in which substrates to be subsequently bonded are set is one in which the bonding substrates are not arranged, and the cassettes mounted with substrates to be newly bonded in Step 23 are not set.

In an operation upon room temperature bonding that makes four substrates into one substrate, as illustrated in FIG. 18, an operator first closes the gate valves 5, and 83-1 to 83-4, and uses the vacuum pump 31 to generate a vacuum ambient inside the bonding chamber 2, a vacuum ambient inside the load lock chamber 3, and an atmospheric pressure ambient inside the cassette chambers 82-1 to 82-4. The operator opens the lids of the cassette chambers 82-1 and 82-2 to arrange the cassette 84-1 loaded with 25 substrates and the cassette 84-2 loaded with 25 substrates in the cassette chambers 82-1 and 82-2, respectively. The operator closes the lids of the cassette chambers 82-1 and 82-2 to generate a vacuum ambient inside the cassette chambers 82-1 and 82-2, and then opens the gate valves 5, 83-1, and 83-2 (Step 31).

The operator uses the transfer device 8 to mount one of the substrates loaded in the cassette 84-1 on the upper substrate support portion 41, and one of the substrates loaded in the cassette 84-2 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-1. Such a bonding operation is repeatedly performed until all of the substrates loaded in the cassette 84-1 are bonded at room temperature and the bonding substrates are loaded in all of the shelves of the cassette 84-1 (Step 32).

During the performance of such bonding operations, the operator opens the lid of the cassette chamber 82-3 to arrange the cassette 84-3 loaded with 25 substrates in the cassette chamber 82-3. The operator closes the lid of the cassette chamber 82-3 to generate a vacuum ambient inside the cassette chamber 82-3.

After the substrates loaded in the cassette 84-1 and the substrates loaded in the cassette 84-2 have been bonded to each other at room temperature and the vacuum ambient has been generated inside the cassette chamber 82-3, the operator bonds the bonded substrates that are loaded in the cassette 84-1 and have been subjected to the room temperature bonding and the substrates loaded in the cassette 84-3 at room temperature. That is, the operator uses the transfer device 8 to mount one of the bonding substrates loaded in the cassette 84-1 on the lower substrate support portion 42, and one of the substrates loaded in the cassette 84-3 on the upper substrate support portion 41. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-3. Such a bonding operation is repeatedly performed until all of the substrates loaded in the cassette 84-1 are bonded at room temperature (Step 33).

After the substrates loaded in the cassette 84-1 and the substrates loaded in the cassette 84-2 have been bonded to each other at room temperature and the vacuum ambient has been generated inside the cassette chamber 82-3, the operator further generates an atmospheric pressure ambient inside the cassette chamber 82-4. The operator opens the lid of the cassette chamber 82-4 to arrange the cassette 84-4 loaded with 25 substrates in the cassette chamber 82-4. The operator closes the lid of the cassette chamber 82-4 to generate a vacuum ambient inside the cassette chamber 82-4, and then opens the gate valves 5 and 83-4 (Step 33).

The operator uses the transfer device 8 to mount one of the bonding substrates loaded in the cassette 84-3 on the lower substrate support portion 42, and one of the substrates loaded in the cassette 84-4 on the upper substrate support portion 41. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-4. Such a bonding operation is repeatedly performed until all of the bonding substrates loaded in the cassette 84-3 are bonded at room temperature (Step 34).

During the performance of such bonding operations, the operator opens the lids of the cassette chambers 82-1 and 82-2 to take the empty cassettes 84-1 and 84-2 out of the cassette chambers 82-1 and 82-2, and then arranges other cassettes 84-1 and 84-2 respectively loaded with another two sets of 25 substrates in the cassette chambers 82-1 and 82-2. The operator closes the lids of the cassette chambers 82-1 and 82-2 to generate a vacuum ambient inside the cassette chambers 82-1 and 82-2 (Step 34).

The operator uses the transfer device 8 to mount one of the substrates loaded in the cassette 84-1 on the upper substrate support portion 41, and one of the substrates loaded in the cassette 84-2 on the lower substrate support portion 42. The operator closes the gate valve 5; bonds the substrates mounted on the upper substrate support portion 41 and the lower substrate support portion 42 at room temperature; and moves up the upper substrate support portion 41 to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-1. Such a bonding operation is repeatedly performed until all of the substrates loaded in the cassette 84-1 are bonded at room temperature and the bonding substrates are loaded on all of the shelves of the cassettes 84-1 (Step 35).

During the performance of such bonding operations, the operator opens the lid of the cassette chamber 82-3 to arrange the cassette 84-3 loaded with 25 substrates in the cassette chamber 82-3. The operator closes the lid of the cassette chamber 82-3 to generate a vacuum ambient inside the cassette chamber 82-3. During the performance of such bonding operations, the operator further opens the lid of the cassette chamber 82-4 to take the cassette 84-4 loaded with the bonding substrates out of the cassette chamber 82-4 (Step 35).

After the substrates loaded in the cassette 84-1 and those loaded in the cassette 84-2 have been bonded to each other at room temperature and the vacuum ambient has been generated inside the cassette chamber 82-3, the operator again bonds the bonding substrates that are loaded in the cassette 84-1 and have been subjected to the room temperature bonding and the substrates loaded in the cassette 84-3 at room temperature, and arranges the cassette 84-4 loaded with 25 substrates in the cassette chamber 82-4.

By repeatedly performing such operations, the operator can continuously perform the room temperature bonding that makes four substrates into one substrate, and continuously manufacture a product in which four substrates are bonded at room temperature. That is, such a room temperature bonding apparatus is not required to generate an atmospheric pressure ambient and then again a vacuum ambient inside the load lock chamber 3 upon continuous manufacturing of the product in which four substrates are bonded at room temperature. At the same time as the bonding process, a cassette loaded with substrates to be subsequently bonded at room temperature is set in a cassette chamber other than two cassette chambers respectively arranged with substrates being bonded. Therefore, the room temperature bonding apparatus can reduce a loss due to a waiting time for exhaust to shorten a tact time, and increase a unit time production quantity of substrates bonded at room temperature more than the room temperature bonding apparatus 1. Note that a cassette chamber to be arranged with the bonding substrates in Step 32 or 33 may be any one of the four cassette chambers. In this case, a cassette chamber in which substrates to be subsequently bonded are set is one that bonding substrates are not arranged and also a cassette mounted with the substrates is not set in the previous step. A cassette chamber to be arranged with the completed bonding substrates in Step 34 may be any one of the two cassette chambers in which cassettes mounted with substrates are set in Step 33. In this case, cassette chambers in which substrates to be subsequently newly bonded are set are the remaining two cassette chambers, excluding the two cassette chambers in which the cassettes mounted with the substrates are set in Step 33. A cassette chamber to be arranged with the bonding substrates in Step 35 may be any one of the cassette chambers excluding the cassette chamber in which the bonding substrates are arranged in Step 34, and in this case, a cassette chamber in which substrates to be subsequently bonded are set is one in which bonding substrates are not arranged, and cassettes mounted with substrates to be newly bonded are not set in Step 34.

Such room temperature bonding apparatus can continuously perform, in the same manner, room temperature bonding that makes five or more substrates into one substrate. That is, upon continuous manufacturing of a product in which five or more substrates are bonded at room temperature, such room temperature bonding apparatus is not required to generate an atmospheric pressure ambient and then again vacuum ambient inside the load lock chamber 3. At the same time as a bonding process, a cassette loaded with substrates to be subsequently bonded at room temperature is set in a cassette chamber other than two cassette chambers respectively arranged with substrates being bonded. Therefore, the room temperature bonding apparatus can reduce a loss due to a waiting time for exhaust to shorten a tact time, and increase a unit time production quantity of substrates bonded at room temperature more than the room temperature bonding apparatus 1.

In the operation upon room temperature bonding that makes two substrates into one substrate, as illustrates in FIG. 19, an operator first closes the gate valves 5, and 83-1 to 83-4, and uses the vacuum pump 31 to generate a vacuum ambient inside the bonding chamber 2, a vacuum ambient inside the load lock chamber, and an atmospheric pressure ambient inside the cassette chambers 82-1 to 82-4. The operator opens the lids of the cassette chambers 82-1 and 82-2 to arrange the cassette 84-1 loaded with 25 substrates in the cassette chamber 82-1 and the cassette 84-2 loaded with 25 substrates in the cassette chamber 82-2. The operator closes the lids of the cassette chambers 82-1 and 82-2 to generate a vacuum ambient inside the cassette chambers 82-1 and 82-2, and then opens the gate valves 5, 83-1, and 83-2 (Step 41).

The operator uses the transfer device 8 to mount one of the substrates loaded in the cassette 84-1 on the upper substrate support portion 41, and one of the substrates loaded in the cassette 84-2 on the lower substrate support portion 42. The operator closes the gate valve 5; bonds the substrates mounted on the upper substrate support portion 41 and the lower substrate support portion 42; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-1. Such a bonding operation is repeatedly performed until all of the substrates loaded in the cassette 84-1 are bonded at room temperature (Step 42).

During the performance of such bonding operations, the operator opens the lids of the cassette chambers 82-3 and 82-4 to arrange the cassette 84-3 loaded with 25 substrates in the cassette chamber 82-3 and the cassette 84-4 loaded with 25 substrates in the cassette chamber 82-4. The operator closes the lids of the cassette chambers 82-3 and 82-4 to generate a vacuum ambient inside the cassette chambers 82-3 and 82-4 (Step 42).

After the substrates loaded in the cassette 84-1 and the substrates loaded in the cassette 84-2 have been bonded to each other at room temperature and the vacuum ambient has been generated inside the cassette chambers 82-3 and 82-4, the operator bonds between the substrates loaded in the cassette 84-3 and those loaded in the cassette 84-4 at room temperature. That is, the operator uses the transfer device 8 to mount one of the substrates loaded in the cassette 84-3 on the upper substrate support portion 41 and one of the substrates loaded in the cassette 84-4 on the lower substrate support portion 42. The operator closes the gate valve 5; bonds the substrates mounted on the upper and lower substrate support portions 41 and 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-3. Such a bonding operation is repeatedly performed until all of the substrates loaded in the cassette 84-3 are bonded at room temperature (Step 43).

During the performance of such bonding operations, the operator opens the lid of the cassette chamber 82-1 to take the cassette 84-1 loaded with the bonding substrates out of the cassette chamber 82-1, and arrange another cassette 84-1 loaded with another set of 25 substrates in the cassette chamber 82-1 and the cassette 84-2 loaded with 25 substrates in the cassette chamber 82-2. The operator closes the lids of the cassette chambers 82-1 and 82-2 to generate a vacuum ambient inside the cassette chambers 82-1 and 82-2, and then opens the gate valves 5, 83-1, and 83-2 (Step 43).

The operator uses the transfer device 8 to mount one of the substrates loaded in the cassette 84-1 on the upper substrate support portion 41, and one of the substrates loaded in the cassette 84-2 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-1. Such a bonding operation is repeatedly performed until all of the substrates loaded in the cassette 84-1 are bonded at room temperature, and the bonding substrates are loaded on all of the shelves of the cassette 84-1 (Step 44).

During the performance of such bonding operations, the operator opens the lid of the cassette chamber 82-3 to take the cassette 84-3 loaded with the bonding substrates out of the cassette chamber 82-3, and arrange another cassette 84-3 loaded with another set of 25 substrates in the cassette chamber 82-3 and the cassette 84-4 loaded with 25 substrates in the cassette chamber 82-4. The operator closes the lids of the cassette chamber 82-3 and 82-4 to generate a vacuum ambient inside the cassette chambers 82-3 and 82-4 (Step 44).

By repeatedly performing such operations (Steps 43 and 44), the operator can continuously manufacture the product in which two substrates are bonded at room temperature. As described, in the operation upon the room temperature bonding that makes two substrates into one substrate with use of the room temperature bonding apparatus 81, during room temperature bonding of two substrates, two cassettes loaded with substrates to be subsequently bonded at room temperature are respectively set in two cassette chambers other than two cassette chambers respectively arranged with the two substrates. In the case where two substrates are bonded to each other at room temperature to form one substrate, the room temperature bonding apparatus 1 in the already-described embodiment is required to generate an atmospheric pressure ambient ant then again vacuum ambient inside the load lock chamber 3 in order to set subsequent substrates after a bonding substrate in which the two substrates are bonded to each other at room temperature has been produced. The room temperature bonding apparatus 81 is not required to generate an atmospheric pressure ambient and then again a vacuum ambient inside the load lock chamber 3 upon continuous manufacturing a product in which two substrates are bonded at room temperature, and therefore can shorten a tact time to increase a unit time production quantity of substrates bonded at room temperature more than the room temperature bonding apparatus 1.

Note that a cassette chamber to be arranged with the completed bonding substrates in Step 42 or 44 may be any one of the cassette chambers in which cassettes loaded with substrates to be newly bonded are set in Step 41 or 43. In this case, a cassette chamber in which substrates to be subsequently newly bonded are to be set is a cassette chamber, excluding the cassette chambers in which cassettes loaded with substrates to be newly bonded are set in Step 41 or 43.

Note that such an operation upon the room temperature bonding that makes two substrates into one substrate can also be performed in still another room temperature bonding apparatus in which the cassette chambers 82-1 and 82-2 are replaced by one first cassette chamber capable of arranging the two cassettes 84-1 and 84-2 inside, and the cassette chambers 82-3 and 82-4 are replaced by one second chamber capable of arranging the two cassettes 84-3 and 84-4 inside. In this case, the room temperature bonding apparatus includes a first gate valve and a second gate valve. The first gate valve is installed between the first cassette chamber and the load lock chamber 3, and closes or opens a gate that makes a connection between an inside of the first cassette chamber and the inside of the load lock chamber 3. The second gate valve is installed between the second cassette chamber and the load lock chamber 3, and closes or opens a gate that makes a connection between an inside of the second cassette chamber and the inside of the load lock chamber 3. Such room temperature bonding apparatus cannot perform the already-described operation upon the room temperature bonding that makes three or more substrates into one substrate, but is simple in structure, which is preferable for the two substrate continuous bonding operation.

In still another embodiment of the room temperature bonding apparatus according to the present invention, the cassette chambers 82-1 and 82-2 of the room temperature bonding apparatus 81 in the already-described embodiment are replaced by one connected cassette chamber. The connected cassette chamber can arrange the two cassettes 84-1 and 84-2 inside. In this case, the room temperature bonding apparatus includes a connected gate valve. The connected gate valve is installed between the connected cassette chamber and the load lock chamber 3, and closes or opens a gate that makes a connection between the inside of the connected cassette chamber and the inside of the load lock chamber 3.

Similarly to the room temperature bonding apparatus 81 in the already-described embodiment, such a room temperature bonding apparatus can perform the operations upon the room temperature bonding that makes two substrates into one substrate, upon the room temperature bonding that makes three or more substrates into one substrate, and of continuously manufacturing such a bonding substrate.

In the operation upon the room temperature bonding that makes two substrates into one substrate, an operator first closes the gate valves 5, 83-3, and 83-4, and connected gate valve, and uses the vacuum pump 31 to generate a vacuum ambient inside the bonding chamber 2, a vacuum ambient inside the load lock chamber 3, an atmospheric pressure ambient inside the cassette chambers 82-3 and 82-4 and connected cassette chamber. The operator opens a lid of the connected cassette chamber to arrange the cassette 84-1 loaded with 25 substrates and the cassette 84-2 loaded with 25 substrates in the connected cassette chamber. The operator closes the lid of the connected cassette chamber to generate a vacuum ambient inside the connected cassette chamber, and then opens the gate valve 5 and connected gate valve.

The operator uses the transfer device 8 to mount one of the substrates loaded in the cassette 84-1 on the upper substrate support portion 41, and one of the substrates loaded in the cassette 84-2 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate set on the lower substrate support portion 42 to an empty shelf in the cassette 84-1. Such a bonding operation is repeatedly performed until all of the substrates loaded in the cassette 84-1 are bonded at room temperature.

During the performance of such bonding operations, the operator opens the lids of the cassette chambers 82-3 and 82-4 to arrange the cassette 84-3 loaded with 25 substrates in the cassette chamber 82-3 and the cassette 84-4 loaded with 25 substrates in the cassette chamber 82-4. The operator closes the lids of the cassette chambers 82-3 and 82-4 to generate a vacuum ambient inside the cassette chambers 82-3 and 82-4.

After the substrates loaded in the cassette 84-1 and the substrates loaded in the cassette 84-2 have been bonded to each other at room temperature and the vacuum ambient has been generated inside the cassette chambers 82-3 and 82-4, the operator bonds the substrates loaded in the cassette 84-3 and those loaded in the cassette 84-4 at room temperature. That is, the operator uses the transfer device 8 to mount one of the substrates loaded in the cassette 84-4 on the upper substrate support portion 41 and one of the substrates loaded in the cassette 84-3 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-3. Such a bonding operation is repeatedly performed until all of the substrates loaded in the cassette 84-3 are bonded at room temperature.

During the performance of such bonding operations, the operator opens the lid of the connected cassette chamber to take the cassette 84-1 loaded with the bonding substrates out of the connected cassette chamber, and arrange another cassette 84-1 loaded with another set of 25 substrates and the cassette 84-2 loaded with 25 substrates in the connected cassette chamber. The operator closes the lid of the connected cassette chamber to generate a vacuum ambient inside the connected cassette chamber, and then opens the gate valve 5 and connected gate valve.

The operator uses the transfer device 8 to mount one of the substrates loaded in the cassette 84-1 on the upper substrate support portion 41, and one of the substrates loaded in the cassette 84-2 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-1. Such a bonding operation is repeatedly performed until all of the substrates loaded in the cassette 84-1 are bonded at room temperature, and the bonding substrates are loaded on all of the shelves of the cassette 84-1.

During the performance of such bonding operations, the operator opens the lid of the cassette chamber 82-3 to take the cassette 84-3 loaded with the bonding substrates out of the cassette chamber 82-3, and arrange another cassette 84-3 loaded with another set of 25 substrates in the cassette chamber 82-3 and the cassette 84-4 loaded with 25 substrates in the cassette chamber 82-4. The operator closes the lids of the cassette chambers 82-3 and 82-4 to generate a vacuum ambient inside the cassette chambers 82-3 and 82-4.

By repeatedly performing such operations, the operator can continuously manufacture the product in which two substrates are bonded to each other at room temperature. In such a room temperature bonding apparatus, during the room temperature bonding of two substrates, two cassettes loaded with substrates to be subsequently bonded at room temperature are respectively set in two cassette chambers other than two cassette chambers respectively arranged with the two substrates. For this reason, upon continuous manufacturing of the product in which two substrates are bonded to each other at room temperature, such room temperature bonding apparatus is not required to generate an atmospheric pressure ambient and then again vacuum ambient inside the load lock chamber 3, and therefore can shorten a tact time to increase a unit time production quantity of substrates bonded at room temperature more than the room temperature bonding apparatus 1. Further, such room temperature bonding apparatus is simpler in structure than the room temperature bonding apparatus 81, and is therefore preferable from the perspectives of apparatus design, manufacturing, and reduction in maintenance cost.

In the operation upon the room temperature bonding that makes three substrates into one substrate, an operator first closes the gate valves 5, 83-3, and 83-4, and connected gate valve, and uses the vacuum pump 31 to generate a vacuum ambient inside the bonding chamber 2, a vacuum ambient inside the load lock chamber 3, and an atmospheric pressure ambient inside the cassette chambers 82-3 and 82-4 and connected cassette chamber. The operator opens the lid of the connected cassette chamber to arrange the cassette 84-1 loaded with 25 substrates and the cassette 84-2 loaded with 25 substrates in the connected cassette chamber. The operator closes the lid of the connected cassette chamber to generate a vacuum ambient inside the connected cassette chamber, and then opens the gate valve 5 and connected gate valve. The operator opens the lid of the cassette chamber 82-3 to arrange the empty cassette 84-3 in the cassette chamber 82. The operator closes the lid of the cassette chamber 82-3 to generate a vacuum ambient inside the cassette chamber 82-3, and then opens the gate valves 5 and 83-3.

The operator uses the transfer device 8 to mount one of the substrates loaded in the cassette 84-1 on the upper substrate support portion 41, and one of the substrates loaded in the cassette 84-2 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-3. Such a bonding operation is repeatedly performed until all of the substrates loaded in the cassette 84-1 are bonded at room temperature, and the bonding substrates are loaded on all of the shelves of the cassette 84-3.

During the performance of such bonding operations, the operator opens the lid of the cassette chamber 82-4 to arrange the cassette 84-4 loaded with 25 substrates in the cassette chamber 82-4. The operator closes the lid of the cassette chamber 82-4 to generate a vacuum ambient inside the cassette chamber 82-4.

After the substrates loaded in the cassette 84-1 and those loaded in the cassette 84-2 have been bonded to each other at room temperature and the vacuum ambient has been generated inside the cassette chamber 82-4, the operator bonds the bonding substrates that are loaded in the cassette 84-3 and have been subjected to the room temperature bonding and the substrates loaded in the cassette 84-4 at room temperature. That is, the operator uses the transfer device 8 to mount one of the bonding substrates loaded in the cassette 84-3 on the lower substrate support portion 42 and one of the substrates loaded in the cassette 84-4 on the upper substrate support portion 41. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-4. Such a bonding operation is repeatedly performed until all of the substrates loaded in the cassettes 84-3 and 84-4 are bonded to each other at room temperature.

After the substrates loaded in the cassette 84-1 and the substrates loaded in the cassettes 84-2 have been bonded to each other at room temperature and the vacuum ambient has been generated inside the cassette chamber 82-3, the operator further generates an atmospheric pressure ambient inside the connected cassette chamber. The operator opens the lid of the connected cassette chamber to arrange the cassette 84-1 loaded with 25 substrates and the cassette 84-2 loaded with 25 substrates in the connected cassette chamber. The operator closes the lid of the connected cassette chamber to generate a vacuum ambient inside the connected cassette chamber, and then opens the gate valve 5 and connected gate valve.

The operator uses the transfer device 8 to mount one of the substrates loaded in the cassette 84-1 on the upper substrate support portion 41, and one of the substrates loaded in the cassette 84-2 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-3. Such a bonding operation is repeatedly performed until all of the substrates loaded in the cassette 84-1 are bonded at room temperature, and the bonded substrates are loaded on all of the shelves of the cassette 84-3.

During the performance of such bonding operations, the operator opens the lid of the cassette chamber 82-4 to take the cassette 84-4 loaded with the bonding substrates out of the cassette chamber 82-4, and arrange another cassette 84-4 loaded with another set of 25 substrates in the cassette chamber 82-4. The operator closes the lid of the cassette chamber 82-4 to generate a vacuum ambient inside the cassette chamber 82-4.

After the substrates loaded in the cassette 84-1 and the substrates loaded in the cassette 84-2 have been bonded to each other at room temperature and the vacuum ambient has been generated inside the cassette chamber 82-4, the operator again bonds the bonding substrates that are loaded in the cassette 84-3 and have been subjected to the room temperature bonding and the substrates loaded in the cassette 84-4 at room temperature, and arranges the cassette 84-1 loaded with 25 substrates and the cassette 84-2 loaded with 25 substrates in the connected cassette chamber.

By repeatedly performing such operations, the operator can continuously perform the room temperature bonding that makes three substrates into one substrate. That is, upon continuous manufacturing of the product in which three substrates are bonded at room temperature, such room temperature bonding apparatus is not required to generate an atmospheric pressure ambient and then again vacuum ambient inside the load lock chamber 3. At the same time in bonding process, a cassette loaded with substrates to be subsequently bonded at room temperature is set in a cassette chamber other than two cassette chambers respectively arranged with substrates being bonded. Therefore, the room temperature bonding apparatus can reduce a loss due to a waiting time for exhaust to shorten a tact time, and therefore can increase a unit time production quantity of substrates bonded at room temperature more than the room temperature bonding apparatus 1. Further, such room temperature bonding apparatus is simpler in structure than the room temperature bonding apparatus 81, and is therefore preferable from the perspectives of apparatus design, manufacturing, and reduction in maintenance cost.

In the operation upon the room temperature bonding that makes four substrates into one substrate, an operator first closes the gate valves 5, 83-3, and 83-4, and connected gate valve, and uses the vacuum pump 31 to generate a vacuum ambient inside the bonding chamber 2, a vacuum ambient inside the load lock chamber 3, and an atmospheric pressure ambient inside the cassette chambers 82-3 and 82-4 and connected cassette chamber. The operator opens the lid of the connected cassette chamber to arrange the cassette 84-1 loaded with 25 substrates and the cassette 84-2 loaded with 25 substrates in the connected cassette chamber. The operator closes the lid of the connected cassette chamber to generate a vacuum ambient inside the connected cassette chamber, and then opens the gate valve 5 and connected gate valve.

The operator uses the transfer device 8 to mount one of the substrates loaded in the cassette 84-1 on the upper substrate support portion 41 and one of the substrates loaded in the cassette 84-2 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-1. Such a bonding operation is repeatedly performed until all of the substrates loaded in the cassette 84-1 are bonded at room temperature, and the bonding substrates are loaded on all of the shelves of the cassette 84-1.

During the performance of such bonding operations, the operator opens the lid of the cassette chamber 82-3 to arrange the cassette 84-3 loaded with 25 substrates in the cassette chamber 82-3. The operator closes the lid of the cassette chamber 82-3 to generate a vacuum ambient inside the cassette chamber 82-3.

After the substrates loaded in the cassette 84-1 and those loaded in the cassette 84-2 have been bonded to each other at room temperature and the vacuum ambient has been generated inside the cassette chamber 82-3, the operator bonds the bonded substrates that are loaded in the cassette 84-1 and have been subjected to the room temperature bonding and the substrates loaded in the cassette 84-3 at room temperature. That is, the operator uses the transfer device 8 to mount one of the bonding substrates loaded in the cassette 84-1 on the lower substrate support portion 42 and one of the substrates loaded in the cassette 84-3 on the upper substrate support portion 41. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-3. Such a bonding operation is repeatedly performed until all of the substrates loaded in the cassette 84-1 are bonded at room temperature.

After the substrates loaded in the cassette 84-1 and the substrates loaded in the cassette 84-2 have been bonded to each other at room temperature and the vacuum ambient has been generated inside the cassette chamber 82-3, the operator further generates an atmospheric pressure ambient inside the cassette chamber 82-4. The operator opens the lid of the cassette chamber 82-4 to arrange the cassette 84-4 loaded with 25 substrates in the cassette chamber 82-4. The operator closes the lid of the cassette chamber 82-4 to generate a vacuum ambient inside the cassette chamber 82-4, and then opens the gate valves 5 and 83-4.

The operator uses the transfer device 8 to mount one of the bonding substrates loaded in the cassette 84-3 on the lower substrate support portion 42 and one of the substrates loaded in the cassette 84-4 on the upper substrate support portion 41. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-4. Such a bonding operation is repeatedly performed until all of the bonding substrates loaded in the cassette 84-3 are bonded at room temperature.

During the performance of such bonding operations, the operator opens the lid of the connected cassette chamber to take the empty cassettes 84-1 and 84-2 out of the connected cassette chamber, and arrange another set of cassettes 84-1 and 84-2 each loaded with another set of 25 substrates in the connected cassette chamber. The operator closes the lid of the connected cassette chamber to generate a vacuum ambient inside the connected cassette chamber.

The operator uses the transfer device 8 to mount one of the substrates loaded in the cassette 84-1 on the upper substrate support portion 41 and one of the substrates loaded in the cassette 84-2 on the lower substrate support portion 42. The operator closes the gate valve 5; bonds the substrates mounted on the upper substrate support portion 41 and the lower substrate support portion 42 at room temperature; and moves up the upper substrate support portion 41 vertically upward to produce a bonding substrate mounted on the lower substrate support portion 42. Then, the operator opens the gate valve 5. The operator uses the transfer device 8 to transfer the bonding substrate mounted on the lower substrate support portion 42 to an empty shelf in the cassette 84-1. Such a bonding operation is repeatedly performed until all of the substrates loaded in the cassette 84-1 are bonded at room temperature and the bonding substrates are loaded on all of the shelves of the cassette 84-1.

During the performance of such bonding operations, the operator opens the lid of the cassette chamber 82-3 to arrange the cassette 84-3 loaded with 25 substrates in the cassette chamber 82-3. The operator closes the lid of the cassette chamber 82-3 to generate a vacuum ambient inside the cassette chamber 82-3. Further, during the performance of such bonding operations, the operator opens the lid of the cassette chamber 82-4 to take the cassette 84-4 loaded with the bonding substrates out of the cassette chamber 82-4.

After the substrates loaded in the cassette 84-1 and those loaded in the cassette 84-2 have been bonded to each other at room temperature and the vacuum ambient has been generated inside the cassette chamber 82-3, the operator again bonds the bonding substrates that are loaded in the cassette 84-1 and have been subjected to the room temperature bonding and the substrates loaded in the cassette 84-3 at room temperature, and arranges the cassette 84-4 loaded with 25 substrates in the cassette chamber 82-4.

By repeatedly performing such operations, the operator can continuously perform the room temperature bonding that makes four substrates into one substrate, and also continuously manufacture the product in which four substrates are bonded at room temperature. That is, upon continuous manufacturing of the product in which four substrates are bonded at room temperature, such room temperature bonding apparatus is not required to generate an atmospheric pressure ambient and then again vacuum ambient inside the load lock chamber 3. At the same time in bonding process, a cassette loaded with substrates to be subsequently bonded at room temperature is set in a cassette chamber other than two cassette chambers respectively arranged with substrates being bonded. Thus, the room temperature bonding apparatus can reduce a loss due to a waiting time for exhaust to shorten a tact time, and therefore increase a unit time production quantity of substrates bonded at room temperature more than the room temperature bonding apparatus 1. Further, such room temperature bonding apparatus is simpler in structure than the room temperature bonding apparatus 81, and is therefore preferable from the perspectives of apparatus design, manufacturing, and reduction in maintenance cost.

Such room temperature bonding apparatus can continuously perform the room temperature bonding that makes five or more substrates into one substrate. That is, upon continuous manufacturing of the product in which five or more substrates are bonded at room temperature, such a room temperature bonding apparatus is not required to generate an atmospheric pressure ambient and then again vacuum ambient inside the load lock chamber 3. At the same time in bonding process, a cassette loaded with substrates to be subsequently bonded at room temperature is set in a cassette chamber other than two cassette chambers respectively arranged with substrates being bonded. Thus, the room temperature bonding apparatus can reduce a loss due to a waiting time for exhaust to shorten a tact time, and therefore increase a unit time production quantity of substrates bonded at room temperature more than the room temperature bonding apparatus 1. Further, such room temperature bonding apparatus is simpler in structure than the room temperature bonding apparatus 81, and is therefore preferable from the perspectives of apparatus design, manufacturing, and reduction in maintenance cost.

Note that the angle adjustment mechanism 12 can be replaced by another angle adjustment mechanism that supports the upper sample stage 13 to the upper stage 11 so as to be able to change a direction of the upper sample stage 13.

Figure 20:
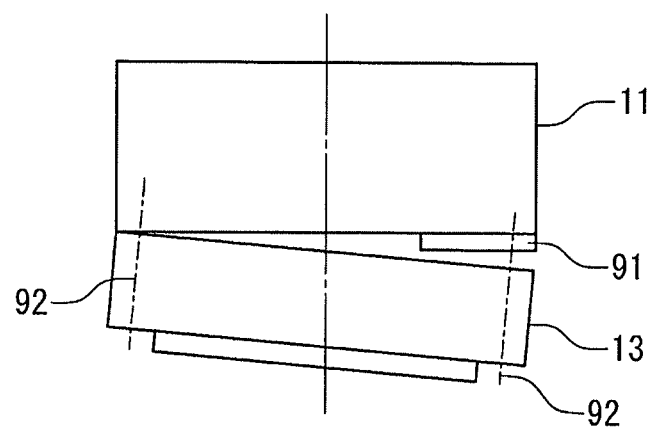
FIG. 20 is a side view illustrating another angle adjustment mechanism.

FIG. 20 illustrates an example of the angle adjustment mechanism replacing the angle adjustment mechanism 12. The angle adjustment mechanism includes a shim 91 and a fastening tool 92. The shim 91 is arranged on a part of an outer circumferential region of a surface of the upper stage 11, which faces to the upper sample stage 13. The fastening tool 92 fastens the upper stage 11 and the upper sample stage 13 together with the shim 19 being sandwiched between the upper stage 11 and the upper sample stage 13, and thereby the upper stage 11 and the upper sample stage 13 are fixed. At this time, in the operation of correcting a direction of the upper sample stage, if the surface of the upper sample stage 13 on which a substrate is arranged and the support surface 52 of the carriage support table 45 (or the surface of the lower sample stage 46 on which a substrate is arranged if the lower sample stage 46 is in contact with the carriage support table 45) are not parallel to each other, an operator arranges an appropriate shim 91 among a plurality of shims respectively having different thicknesses at an appropriate position of the outer circumferential region of the surface of the upper stage 11, which faces to the upper sample stage 13, and uses the fastening tool 92 to fix the upper stage 11 and the upper sample stage 13 together.

According to such an angle adjustment mechanism, when a substrate on the upper sample stage 13 is bonded to a substrate on the lower sample stage 46 at room temperature, the room temperature bonding apparatus according to the present invention can more uniformly impose a load on bonding surfaces of the substrate on the upper sample stage 13 and the substrate on the lower sample stage 46 in the same manner as in the angle adjustment mechanism 12 in the already-described embodiment.

Figure 21:
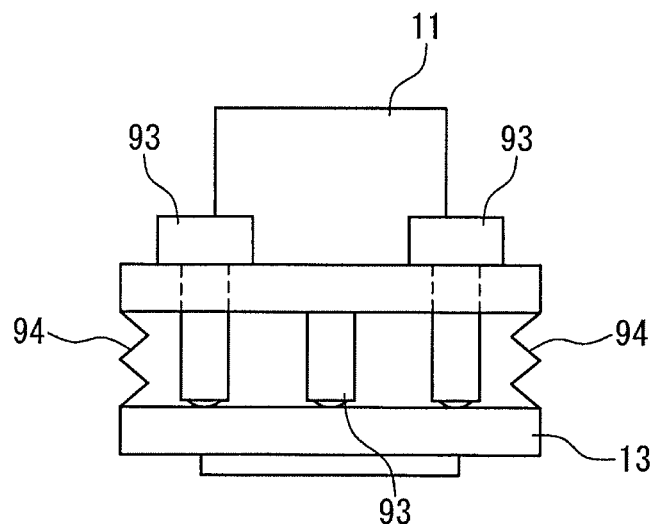
FIG. 21 is a side view illustrating still another angle adjustment mechanism.
Figure 22:
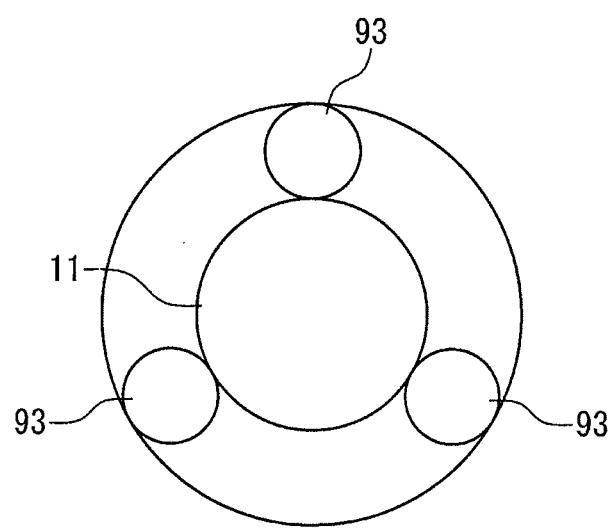
FIG. 22 is a plan view illustrating the still another angle adjustment mechanism.

FIG. 21 illustrates another example of the angle adjustment mechanism replacing the angle adjustment mechanism 12. The angle adjustment mechanism includes three press bolts 93 and tension spring 94. The tension spring 94 applies elastic force to the upper sample stage 13 with respect to the upper stage 11 such that the upper stage 11 and the upper sample stage 13 attract each other. The press bolts 93 are, as illustrated in FIG. 22, arranged at three sites on the outer circumferential region of the surface of the upper stage 11, which faces to the upper sample stage 13. The press bolts 93 are respectively rotated, and thereby a pressing amount by which the upper sample stage 13 is pressed from the upper stage 11 changes. At this time, in the operation of correcting a direction of the upper sample stage, if the surface of the upper sample stage 13 on which a substrate is arranged and the support surface 52 of the carriage support table 45 (or the surface of the lower sample stage 46 on which a substrate is arranged if the lower sample stage 46 is in contact with the carriage support table 45) are not parallel to each other, an operator appropriately rotates the press bolts 93 to thereby parallelize the surface of the upper sample stage 13 on which a substrate is arranged and the support surface 52 of the carriage support table 45 with each other.

According to such an angle adjustment mechanism, when the substrate on the upper sample stage 13 is bonded to the substrate on the lower sample stage 46 at room temperature, the room temperature bonding apparatus according to the present invention can more uniformly impose a load on bonding surfaces of the substrate on the upper sample stage 13 and the substrate on the lower sample stage 46 in the same manner as in the angle adjustment mechanism 12 in the already-described embodiment.

Figure 23:
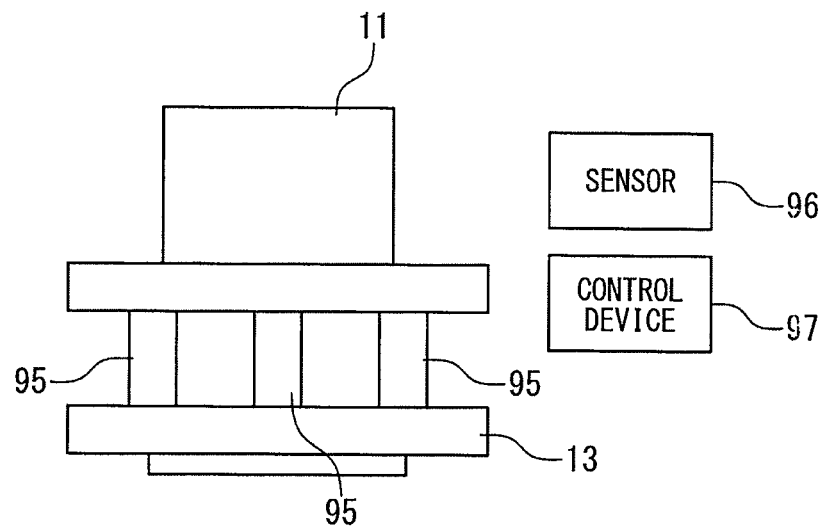
FIG. 23 is a side view illustrating yet another angle adjustment mechanism.
Figure 24:
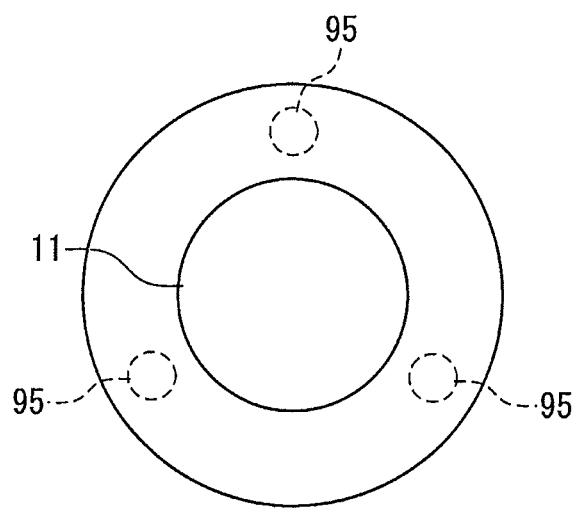
FIG. 24 is a plan view illustrating the yet another angle adjustment mechanism.

FIG. 23 illustrates still another example of the angle adjustment mechanism replacing the angle adjustment mechanism 12. The angle adjustment mechanism includes three piezo elements 95, a sensor 96, and a controller 97. The sensor 96 measures a direction of the upper sample stage 13. The controller 97 is a computer, and applies an appropriate voltage to the piezo elements 95 on the basis of the direction of the upper sample stage 13 measured by the sensor 96, or an operator's operation. The piezo elements 95 are, as illustrates in FIG. 24, arranged at three sites of the outer circumferential region of the surface of the upper stage 11, which faces to the upper sample stage 13. The piezo element 95 changes a length thereof on the basis of the applied voltage.

At this time, in the operation of correcting a direction of the upper sample stage, an operator uses the sensor 96 to measure a direction of the upper sample stage 13. If the surface of the upper sample stage 13 on which a substrate is arranged and the support surface 52 of the carriage support table 45 (or the surface of the lower sample stage 46 on which a substrate is arranged if the lower sample stage 46 is in contact with the carriage support table 45) are not parallel to each other, the operator appropriately operates the controller 97 to thereby apply an appropriate voltage to the piezo elements 95, and thereby parallelizes the surface of the upper sample stage 13 on which a substrate is arranged and the support surface 52 of the carriage support table 45 with each other.

According to such an angle adjustment mechanism, when the substrate on the upper sample stage 13 is bonded to the substrate on the lower sample stage 46 at room temperature, the room temperature bonding apparatus according to the present invention can more uniformly impose a load on bonding surfaces of the substrate on the upper sample stage 13 and the substrate on the lower sample stage 46 in the same manner as in the angle adjustment mechanism 12 in the already-described embodiment.

Further, such an angle adjustment mechanism can parallelize the surface of the upper-sample stage 13 on which a substrate is arranged and the surface of the lower sample stage 46 on which a substrate is arranged with each other without exposing the bonding chamber 2 to air. That is, in the operation of correcting a direction of the upper sample stage, the controller 97 uses the sensor 96 to measure a direction of the upper sample stage 13, and on the basis of a result of the measurement, applies an appropriate voltage to the piezo elements 95 to parallelize the surface of the upper sample stage 13 on which a substrate is arranged and the surface of the lower sample stage 46 on which a substrate is arranged with each other. Such an operation can be performed without exposing the bonding chamber 2 to air, and for example, can be performed during a period when the steps S4 to S8 of FIG. 15 are repeated excluding the period when the step S6 is performed. For this reason, according to such an operation, even if a direction of the upper sample stage 13 is changed during the period when the steps S4 to S8 are repeated, an adjustment can be made so as to parallelize the surface of the upper sample stage 13 on which a substrate is arranged and the surface of the lower sample stage 46 on which a substrate is arranged with each other, and therefore a time to bond substrates at room temperature can be shortened.

Note that the upper sample stage 13 and the lower sample stage 46 can be replaced by sample stages that respectively fix substrates on the basis of another mechanism different from the mechanical lock mechanism.

Figure 25:
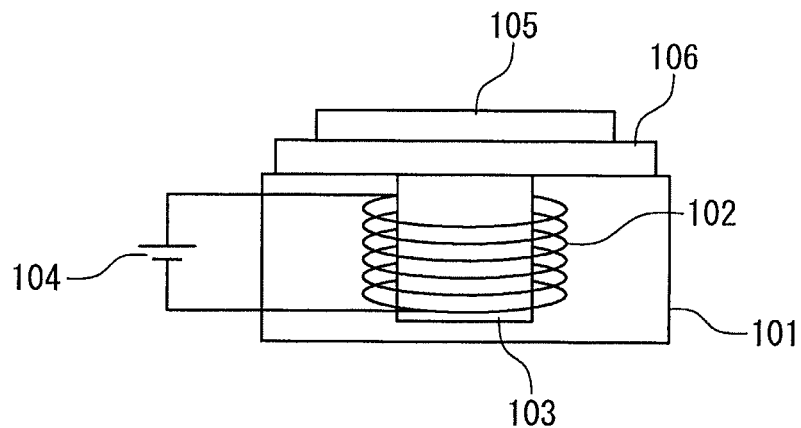
FIG. 25 is a side view illustrating another sample stage.

FIG. 25 illustrates an example of the sample stage replacing the upper sample stage 13 or the lower sample stage 46. The sample stage 101 includes a coil 102, a magnetic material 103, and a power supply 104. The magnetic material 103 is formed in a rod-like shape, and arranged inside the sample stage 101. The coil 102 is formed of electric wire that is wound around the magnetic material 103, and applied with a DC current to thereby generate magnetic force. The power supply 104 applies the DC current to the coil 102, or stops applying the DC current to the coil, by the user's operation. A substrate 105 held by the sample stage 101 is bonded to a cartridge 106 with use of a wafer tape (not shown). The cartridge 106 is formed of a ferromagnetic material. The sample stage 101 holds the substrate 105 by arranging the substrate 105 bonded to the cartridge 106 on the sample stage 101 and then applying the DC current to the coil 102. After the application of the DC current to the coil 102 has been stopped, the substrate 105 bonded to the cartridge 106 is removed from the sample stage 101. Such sample stage 101 can hold the substrate 43 even if the substrate 105 is not ferromagnetic, and is therefore preferable.

Figure 26:
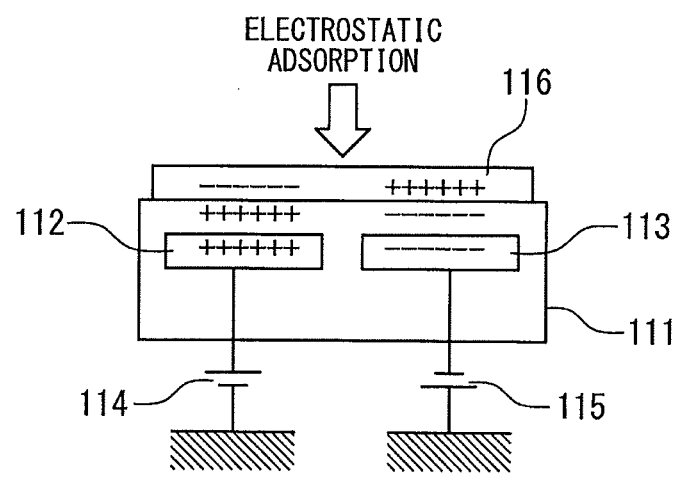
FIG. 26 is a side view illustrating still another sample stage.

FIG. 26 illustrates another example of the sample stage replacing the upper sample stage 13 or the lower sample stage 46. The sample stage 111 includes electrodes 112 and 113, and power supplies 114 and 115. The electrodes 112 and 113 are arranged inside the sample stage 111. The power supply 114 applies a voltage to the electrode 112 or stops applying the voltage to the electrode 112 by the user's operation. The power supply 115 applies a voltage to the electrode 113 or stops applying the voltage to the electrode 113 by the user's operation. The sample stage 111 holds a substrate 116 on the basis of electrostatic force that is generated between the sample stage 111 and the substrate 116 by arranging the substrate 116 on the sample stage 111 and then applying the voltages to the electrodes 112 and 113. After the application of the voltages to the electrodes 112 and 113 has been stopped, the substrate 116 is removed from the sample stage 111. Such a sample stage 111 can be applied to the room temperature bonding apparatus in the case where the substrate 116 is allowed to be applied with electrostatic force. That is, the sample stage can be applied with various mechanisms as far as specifications of a substrate to be held by the sample stage permit.

The room temperature bonding apparatus according to the present invention can reduce a load imposed on a second driving device, and impose a larger load exceeding a withstand load of the second driving device on a first substrate and a second substrates when the first substrate and the second substrate are brought into pressure contact with each other. Further, the room temperature bonding apparatus according to the present invention can more uniformly impose a larger load on bonding surfaces of the first substrate and the second substrate.

The invention claimed is:

1. A room temperature bonding apparatus comprising:
a first driving device configured to be arranged in an upper portion of a bonding chamber and drive in a first direction a first stage supporting a first sample stage holding a first substrate;
a second driving device configured to be arranged in a lower portion of the bonding chamber and drive in a second direction not parallel to said first direction a second sample stage holding a second substrate;
a carriage support table configured to include a transparent portion which passes through the carriage support table from a first position where the second sample stage is placed to a second position which is a lower part of the carriage support table and, when said second substrate and said first substrate are brought into press contact with each other, support said second sample stage in said first direction;
a light source configured to be arranged at a position below the second position and emit light through said transparent portion toward said second substrate;
a camera configured to be arranged at a position below the second position and capture reflected light of said emitted light reflected back through said transparent portion by an alignment mark patterned on said first substrate or said second substrate; and
a mechanical lock mechanism configured to fix a cartridge, which holds the second substrate, to the second sample stage,
wherein the mechanical lock mechanism includes,
a plurality of pins movably supported by the second sample stage, and
a cam configured to move the plurality of pins by rotating the cam such that the plurality of pins engage a plurality of holes of the cartridge respectively.

2. The room temperature bonding apparatus according to claim 1, further comprising:
a bonding chamber configured to arrange said first sample stage and said second sample stage inside;
a vacuum pump configured to exhaust gas from said inside of said bonding chamber through an exhaust port formed in said bonding chamber to generate a vacuum ambient inside said bonding chamber;
a gate valve configured to open or close between a load lock chamber and said bonding chamber;
a transfer device configured to transfer said first substrate and said second substrate from said load lock chamber to said bonding chamber through said gate valve; and
a surface cleaning device configured to, when a first surface facing to said second substrate of said first substrate and a second surface facing to said first substrate of said second substrate are separated from each other, irradiate a region between said first surface and said second surface with particles emitted from one site in said vacuum ambient,
wherein a centerline of a beam of said particles faces to a region excluding said exhaust port and said gate valve of an inner surface of said bonding chamber.

3. The room temperature bonding apparatus according to claim 1, wherein said transparent portion is included in said carriage support table in top plan view.

4. The room temperature bonding apparatus according to claim 3, wherein said carriage support table includes:
a plurality of transparent portions including said transparent portion,
wherein said plurality of transparent potions are included in said carriage support table in top plan view.

5. The room temperature bonding apparatus according to claim 4, wherein said carriage support table further includes:
a plurality of cameras including said camera,
wherein each of said plurality of cameras corresponds to one of said plurality of transparent portions in a one-to-one relation.

6. The room temperature bonding apparatus according to claim 1, wherein
said emitted light contains infrared light, and
said transparent portion is formed of material that is transparent to infrared light emitted by said light source.

7. A room temperature bonding method comprising:
providing a room temperature bonding apparatus, said room temperature bonding apparatus including:
a first driving device configured to be arranged in an upper portion of a bonding chamber and drive in a first direction a first stage supporting a first sample stage,
a second driving device configured to be arranged in a lower portion of the bonding chamber and drive in a second direction not parallel to said first direction a second sample stage,
a carriage support table configured to include a transparent portion which passes through the carriage support table from a first position where the second sample stage is placed to a second position which is a lower part of the carriage support table and support said second sample stage in said first direction,
a light source configured to be arranged at a position below the second position and emit light;
a camera configured to be arranged at a position below the second position and capture an image; and
a mechanical lock mechanism configured to fix a cartridge, which holds the second substrate, to the second sample stage,
wherein said carriage support table is formed with a transparent portion, the carriage support table being solid;
wherein the mechanical lock mechanism includes,
a plurality of pins movably supported by the second sample stage, and
a cam configured to move the plurality of pins by rotating the cam,
holding a first substrate by said first sample stage;
holding a second substrate by said second sample stage;
supporting said second sample stage in said first direction by said carriage support table;
emitting said light through said transparent portion toward said second substrate;
capturing, by said camera, reflected light of said emitted light reflected back through said transparent portion by an alignment mark patterned on said first substrate or said second substrate;

adjusting, based on the captured reflected light, a position of said second substrate with respect to said first substrate by said second driving device; and bringing into press contact with said first substrate and said second substrate by said first driving device, wherein holding a second substrate by said second sample stage includes rotating the cam such that the plurality of pins engages a plurality of holes of the cartridge, respectively.

8. The room temperature bonding apparatus according to claim 1, wherein said first sample stage holds said first substrate including multi-layers of a substrate.

9. The room temperature bonding method according to claim 7, wherein said first substrate holding step includes the sub-step of:

holding the first substrate including multi-layers of a substrate by said first sample stage.

10. The room temperature bonding apparatus according to claim 1, further comprising:

elastic guides configured to be integrally bonded to said second sample stage, wherein said second driving device supports and drives said elastic guides to drive said second sample stage, and wherein said elastic guide is elastically deformed such that said second sample stage does not come into contact with said carriage support table when said first substrate and said second substrate are not in contact with each other, and said second sample stage comes into contact with said carriage support table when said first substrate and said second substrate are brought into press contact with each other.

* * * * *